(12) United States Patent
Ishige et al.

(10) Patent No.: US 10,985,526 B2
(45) Date of Patent: *Apr. 20, 2021

(54) LASER DEVICE AND LIGHT-SOURCE DEVICE

(71) Applicant: FURUKAWA ELECTRIC CO., LTD., Tokyo (JP)

(72) Inventors: Yuta Ishige, Tokyo (JP); Etsuji Katayama, Tokyo (JP); Atsushi Oguri, Tokyo (JP); Hajime Mori, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/422,367

(22) Filed: May 24, 2019

(65) Prior Publication Data
US 2019/0288484 A1 Sep. 19, 2019

Related U.S. Application Data

(63) Continuation of application No. PCT/JP2017/042196, filed on Nov. 24, 2017.

(30) Foreign Application Priority Data

Nov. 25, 2016 (JP) ................. 2016-229524

(51) Int. Cl.
*H01S 5/022* (2021.01)
*H01S 5/40* (2006.01)
(Continued)

(52) U.S. Cl.
CPC .......... *H01S 5/02284* (2013.01); *H01S 3/067* (2013.01); *H01S 3/0941* (2013.01);
(Continued)

(58) Field of Classification Search
CPC ....... H01S 3/0941–09415; H01S 5/022; H01S 5/02208–02216; H01S 5/02284;
(Continued)

(56) References Cited

U.S. PATENT DOCUMENTS 5,675,685 A * 10/1997 Fukuda ................ G02B 6/4249
257/98
6,124,973 A * 9/2000 Du ........................ G02B 27/09
359/618
(Continued)

FOREIGN PATENT DOCUMENTS

CN 201203679 Y 3/2009
CN 102272648 A 12/2011
(Continued)

OTHER PUBLICATIONS

International Search Report dated Feb. 13, 2018 in PCT/JP2017/042196 filed Nov. 24, 2017 (with English Translation).
(Continued)

*Primary Examiner* — Joshua King
(74) *Attorney, Agent, or Firm* — Oblon, McClelland, Maier & Neustadt, L.L.P.

(57) ABSTRACT

A laser device that is easily assembled and can be manufactured at a low cost and a light-source device using the same are provided. The laser device includes a mount member including a mount surface, and a semiconductor laser element placed on the mount surface of the mount member. An upper side and lateral sides of the semiconductor laser element on the mount surface are exposed.

10 Claims, 11 Drawing Sheets

(51) Int. Cl.
*H01S 3/0941* (2006.01)
*H01S 3/067* (2006.01)

(52) U.S. Cl.
CPC .......... *H01S 5/022* (2013.01); *H01S 5/02248* (2013.01); *H01S 5/40* (2013.01); *H01S 5/4012* (2013.01); *H01S 5/4025* (2013.01)

(58) Field of Classification Search
CPC .. H01S 5/02292; H01S 5/4012; H01S 5/4075; H01S 5/4025–4031; H01L 23/049; H01L 23/053; H01L 25/0753
See application file for complete search history.

(56) References Cited

U.S. PATENT DOCUMENTS

| | | | | |
|---|---|---|---|---|
| 6,499,888 | B1* | 12/2002 | Wu | G02B 6/4203 385/88 |
| 9,008,137 | B1* | 4/2015 | Plummer | H01S 5/4012 372/35 |
| 9,373,932 | B2 | 6/2016 | Hayamizu et al. | |
| 9,413,136 | B1* | 8/2016 | Vethake | H01S 5/02423 |
| 9,692,205 | B2 | 6/2017 | Matsuyama et al. | |
| 9,746,627 | B2 | 8/2017 | Ishige et al. | |
| 10,061,092 | B2 | 8/2018 | Ishige et al. | |
| 2007/0036185 | A1 | 2/2007 | Tanaka | |
| 2009/0245315 | A1* | 10/2009 | Faybishenko | G02B 6/4206 372/50.12 |
| 2012/0051377 | A1* | 3/2012 | Liang | H01S 5/0092 372/36 |
| 2012/0081893 | A1* | 4/2012 | Faybishenko | G02B 6/4296 362/235 |
| 2013/0105961 | A1* | 5/2013 | Jones | H01L 23/049 257/691 |
| 2014/0086539 | A1* | 3/2014 | Goutain | F21V 9/30 385/89 |
| 2014/0110833 | A1* | 4/2014 | Yoo | H01L 21/4853 257/697 |
| 2014/0241388 | A1* | 8/2014 | Yamanaka | H01L 23/045 372/43.01 |
| 2015/0295386 | A1* | 10/2015 | Hemenway | H01S 5/2036 372/46.01 |
| 2015/0349481 | A1* | 12/2015 | Kliner | H01S 3/0675 359/341.3 |
| 2016/0079728 | A1 | 3/2016 | Matsuyama et al. | |
| 2016/0093589 | A1* | 3/2016 | Sato | H01L 21/4846 257/690 |
| 2016/0246022 | A1 | 8/2016 | Ishige et al. | |
| 2017/0271837 | A1* | 9/2017 | Hemenway | H01S 3/0941 |
| 2017/0315311 | A1 | 11/2017 | Ishige et al. | |
| 2017/0358900 | A1* | 12/2017 | Kanskar | H01S 5/02284 |
| 2018/0278013 | A1* | 9/2018 | Kanskar | H01S 5/02423 |
| 2019/0157835 | A1* | 5/2019 | Ishige | H01S 3/06754 |
| 2019/0280459 | A1* | 9/2019 | Ishige | G02B 6/4214 |

FOREIGN PATENT DOCUMENTS

| | | | | |
|---|---|---|---|---|
| CN | 102646922 A | 8/2012 | | |
| CN | 202600259 U | 12/2012 | | |
| CN | 102916341 A | 2/2013 | | |
| CN | 204205281 U | 3/2015 | | |
| CN | 104836113 A | 8/2015 | | |
| CN | 104836119 A | 8/2015 | | |
| CN | 105207054 A | 12/2015 | | |
| CN | 105518505 A | 4/2016 | | |
| CN | 205141362 U | 4/2016 | | |
| CN | 205507157 U | 8/2016 | | |
| DE | 10204397 A1 * | 8/2002 | .......... H01S 5/4031 |
| DE | 102010000908 A1 * | 7/2011 | .......... H01L 25/072 |
| DE | 102015113758 A1 * | 3/2016 | ......... H01S 5/02469 |
| EP | 3595103 A1 * | 1/2020 | ......... H01S 5/02256 |
| JP | H11-220191 A | 8/1999 | | |
| JP | 2001-264590 | 9/2001 | | |
| JP | 2001-337250 A | 12/2001 | | |
| JP | 2003-338654 | 11/2003 | | |
| JP | 2003338654 A * | 11/2003 | | |
| JP | 2010-232373 | 10/2010 | | |
| JP | 202383321 U | 8/2012 | | |
| JP | 2013-239672 | 11/2013 | | |
| JP | 2015-5627 | 1/2015 | | |
| JP | 5730814 B2 | 6/2015 | | |
| JP | 2016-99573 | 5/2016 | | |
| WO | WO-2015162767 A1 * | 10/2015 | ......... G03B 21/2033 |
| WO | WO-2018163235 A1 * | 9/2018 | ......... H01S 5/02256 |

OTHER PUBLICATIONS

Written Opinion dated Feb. 13, 2018 in PCT/JP2017/042196 filed Nov. 24, 2017.
Combined Chinese Office Action and Search Report dated Jun. 1, 2020, in Patent Application No. 201780071878.6 (with English translation), 14 pages.
The First Office Action dated Jun. 30. 2020 in corresponding Chinese Patent Application No. 201780071979.3 (with English translation)(15 pages).

* cited by examiner

US 10,985,526 B2

LASER DEVICE AND LIGHT-SOURCE DEVICE

CROSS-REFERENCE TO RELATED APPLICATIONS

This application is a continuation application of International Application No. PCT/JP2017/042196, filed Nov. 24, 2017, which claims the benefit of Japanese Patent Application No. 2016-229524, filed Nov. 25, 2016. The contents of the aforementioned applications are incorporated herein by reference in their entireties.

TECHNICAL FIELD

The disclosure relates to a laser device including a semiconductor laser element and a light-source device including a plurality of laser devices.

BACKGROUND ART

Semiconductor lasers have characteristics such as low power consumption and small size, and have been widely used in various fields such as optical communication, optical recording, and material processing. As a semiconductor laser module on which a semiconductor laser is mounted, a module provided with a plurality of semiconductor lasers in a package is known (Patent Document 1).

CITATION LIST

Patent Literature

Patent Document 1: Japanese Patent No. 5730814

SUMMARY

Technical Problem

In a conventional semiconductor laser module, a side wall portion of a housing of a package is provided with an output unit that includes an optical fiber and a terminal unit including an electrode such as a lead pin. The electrode of the terminal unit provided on the side wall portion of the housing in such a manner needs to be electrically connected to a semiconductor laser element housed in the housing. Also, the optical fiber of the output unit provided on the side wall portion of the housing needs to be aligned with respect to laser light that has been output from the laser light element housed in the housing and undergone reflection and condensing by an optical element.

As described above, in the conventional semiconductor laser module, the semiconductor laser element and the like housed in the housing need to be electrically connected, and optically and positionally aligned to a member provided on the side wall portion of the housing. For this reason, the conventional semiconductor laser module has not been easily assembled and has been thus difficult to be manufactured at a low cost.

Furthermore, in the conventional semiconductor laser module, since the semiconductor laser element and the optical element such as a lens are housed in the housing, it is not easy to observe laser light, which is output from the semiconductor laser element, in the module. Thus, aligning of the optical fiber in the output unit has been difficult in the conventional semiconductor laser module. For such a reason as well, the conventional semiconductor laser module has not been easily assembled and thus has been difficult to be manufactured at a low cost.

In view of the above, an object of the disclosure is to provide a laser device that is easily assembled and can be manufactured at a low cost and a light-source device using the laser device.

Solution to Problem

According to one aspect of the disclosure, a laser device is provided that includes a mount member including a mount surface, and a semiconductor laser element placed on the mount surface of the mount member, an upper side and lateral sides of the semiconductor laser element on the mount surface being exposed.

According to another aspect of the disclosure, a light-source device is provided that includes a plurality of the laser devices, and a base member including a placement surface on which the plurality of laser devices are placed.

According to still another aspect of the disclosure, an optical fiber laser includes the light-source device, an optical fiber for amplification, and an incidence unit that causes laser light, output from the plurality of laser devices of the light-source device, to be incident on the optical fiber for amplification.

Advantageous Effects of Invention

According to the disclosure, a laser device that is easily assembled and can be manufactured at a low cost and a light-source device using the laser device can be provided.

DESCRIPTION OF EMBODIMENTS

First Embodiment

A laser device and a light-source device according to a first embodiment of the disclosure will be described using FIG. 1 to FIG. 4.

Figure 1:
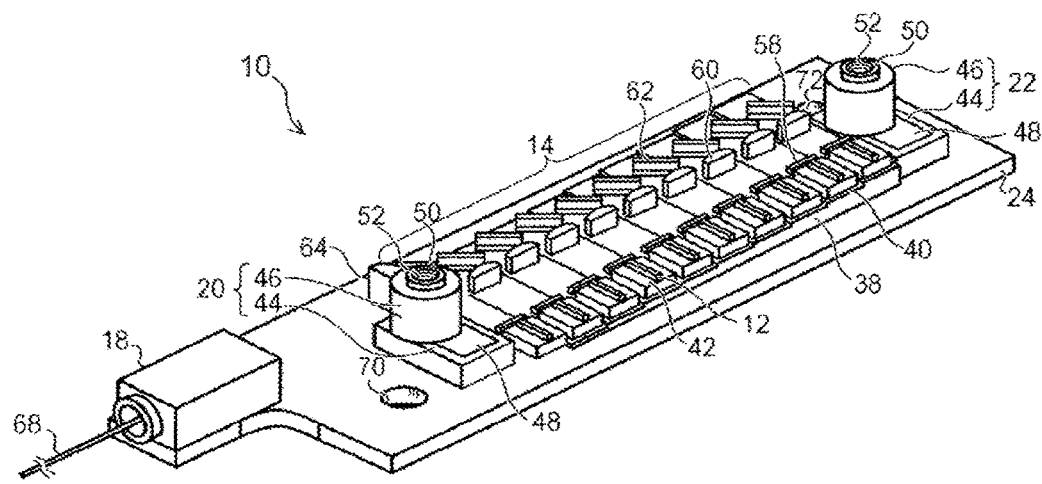
FIG. 1 is a perspective view illustrating a laser device according to a first embodiment of the disclosure.

First, a configuration of the laser device according to the present embodiment will be described using FIG. 1. FIG. 1 is a perspective view illustrating the laser device according to the present embodiment.

The laser device according to the present embodiment is a semiconductor laser module including a plurality of semiconductor laser elements as laser elements. As illustrated in FIG. 1, a laser device 10 according to the present embodiment includes a plurality of semiconductor laser elements 12 and an optical system 14 provided to correspond to the plurality of semiconductor laser elements 12. The laser device 10 according to the present embodiment further includes a base plate portion 24, which is a mount member having thereon the plurality of semiconductor laser elements 12, the optical system 14, and the like. The laser device 10 according to the present embodiment further includes an output unit 18 that outputs laser light and terminal units 20 and 22, each of which can be electrically connected to the outside.

The base plate portion 24 is a plate member having a planar shape such as a substantially rectangular shape, for example, which extends long in one direction, and includes an upper surface and a lower surface facing the upper surface. The base plate portion 24 constitutes the mount member together with a stepped portion 38 described later. In the base plate portion 24, one end portion and the other end portion facing each other in a length direction thereof are a front end portion and a rear end portion, respectively. Note that the shape of the base plate portion 24 is not particularly limited to a planar shape, and various shapes can be adopted.

The mount member constituted by the base plate portion 24 and the stepped portion 38 includes a plurality of mount surfaces on which the semiconductor laser elements 12, the optical system 14, the terminal units 20 and 22, and the like are mounted. Specifically, the upper surface of the base plate portion 24 and upper surfaces of a plurality of steps 40 in the stepped portion 38 are the mount surfaces. The upper surfaces of the plurality of steps 40 each are a mount surface parallel to the upper surface of the base plate portion 24, and have different heights from one another from the upper surface of the base plate portion 24.

The upper surface of the base plate portion 24 and the upper surfaces of the plurality of steps 40 constituting the mount surfaces are each a plane surface, and are each an open surface that is exposed upward in a space above the surface without being covered with a top plate and the like and is also exposed laterally in the space above the surface without being covered with side walls and the like. Note that the space above the surface herein is a space including the semiconductor laser elements 12, the optical system 14, the terminal units 20 and 22, and the like mounted on the upper surface of the base plate portion 24 and the upper surfaces of the plurality of steps 40. In other words, the laser device 10 according to the present embodiment is exposed on upper and lateral sides of the semiconductor laser elements 12, the optical system 14, the terminal units 20 and 22, and the like, which are placed on the mount surfaces including the upper surface of the base plate portion 24 and the upper surfaces of the plurality of steps 40.

Note that the mount member on which the semiconductor laser elements 12, an optical element constituting the optical system 14, and the like are mounted is not limited to a member constituted by a plate member, like the base plate portion 24, and the stepped portion 38 provided on the plate member. The mount member may include one or a plurality of mount surfaces on which the semiconductor laser elements 12, the optical element, and the like may be mounted. Further, the mount surface may be a plane surface and also be a curved surface or an uneven surface, but may preferably be a plane surface.

The plurality of semiconductor laser elements 12, the optical system 14, and a condenser lens 64 to be described later are provided on the upper surface of the base plate portion 24. Further, as described later, the terminal units 20 and 22 are provided on the upper surface of the base plate portion 24.

As described later, the base plate portion 24 has a lower surface that is brought into contact with and placed on a placement surface of a substrate, when the laser device 10 is placed on the substrate. The stepped portion 38 is provided on the upper surface of the base plate portion 24. The stepped portion 38 has a stepped shape and includes the plurality of steps 40 provided to be aligned along a front-back direction of the base plate portion 24. The plurality of steps 40 of the stepped portion 38 gradually increase in height from the front toward the rear. In other words, the upper surfaces of the plurality of steps 40, each of which is the mount surface, increase in height from the upper surface of the base plate portion 24 greater at the rear than at the front. The stepped portion 38 may be integrally formed with the base plate portion 24, or may be a separate component that is fixed to the base plate portion 24 by soldering and the like.

The plurality of semiconductor laser elements 12 are placed on the upper surface of the base plate portion 24 and the upper surfaces of the plurality of steps 40 of the stepped portion 38. The plurality of semiconductor laser elements 12 are, for example, the same semiconductor laser elements having the same oscillation wavelength, output, and other laser characteristic. Note that the number of the plurality of semiconductor laser elements 12 is not particularly limited, and may be appropriately set according to laser output and the like required for the laser device 10.

The plurality of semiconductor laser elements 12 are elements formed individually separate from each other on different chips. Each of the semiconductor laser elements 12 is placed on the upper surface of the base plate portion 24 and each of the plurality of steps 40 of the stepped portion 38 in a chip-on-submount (COS) form by being fixed to a submount 42 by soldering and the like and equipped thereon, for example.

The plurality of semiconductor laser elements 12 placed on the base plate portion 24 and the plurality of steps 40 of the stepped portion 38 are aligned in one line along the length direction of the base plate portion 24. The plurality of semiconductor laser elements 12 that are aligned in one line differ in height, with the difference being provided by the stepped portion 38. The plurality of semiconductor laser elements 12 are arranged such that an output direction of laser light of each of the semiconductor laser elements 12 is in a short-side direction of the base plate portion 24. The plurality of semiconductor laser elements 12 aligned in one line are arranged so as to output laser light toward the same one side of the alignment. Note that the plurality of semiconductor laser elements 12 may be provided not only in one line but also in a plurality of lines.

In the alignment of the plurality of semiconductor laser elements 12, electrodes of the semiconductor laser elements 12 adjacent to each other are electrically connected to each other by wire bonding and the like. In this way, the plurality of semiconductor laser elements 12 are connected in series. Note that a method for electrically connecting the semiconductor laser elements 12 is not particularly limited, and various methods can be used. For example, a method based on wire bonding described in JP 2015-185667 A can be used.

The terminal unit 20 is provided on the upper surface of the base plate portion 24 on the front side of the alignment of the plurality of semiconductor laser elements 12. Also, the terminal unit 22 is provided on the upper surface of the base plate portion 24 on the rear side of the alignment of the plurality of semiconductor laser elements 12. The terminal units 20 and 22 each can be electrically connected to an external driving power source, and are used to apply a driving current to each of the plurality of semiconductor laser elements 12 by the driving power source. One of the terminal units 20 and 22 is connected to a positive terminal of the driving power source, and the other is connected to a negative terminal of the driving power source.

The terminal units 20 and 22 each include an element connecting portion 44 and an external connecting portion 46 electrically connected to the element connecting portion 44. The terminal units 20 and 22 each utilize a screw as a connection form when being electrically connected to the outside.

The element connecting portion 44 of each of the terminal units 20 and 22 is provided on the upper surface of the base plate portion 24. In this way, the element connecting portion 44, which a part of each of the terminal units 20 and 22, is provided on the base plate portion 24. The element connecting portion 44 of each of the terminal units 20 and 22 includes a sheet-like conductor 48. The sheet-like conductor 48 is provided in parallel with the base plate portion 24. The sheet-like conductor 48 is electrically connected, via a wire by wire bonding, for example, to an electrode of the semiconductor laser element 12 that is at an end portion in the alignment of the plurality of semiconductor laser elements 12 connected in series.

More specifically, the sheet-like conductor 48 of the element connecting portion 44 in the terminal unit 20 is electrically connected, via a wire by wire bonding, to an electrode of the semiconductor laser element 12 at a front end portion in the alignment of the plurality of semiconductor laser elements 12 connected in series. Further, the sheet-like conductor 48 of the element connecting portion 44 in the terminal unit 22 is electrically connected, via a wire by wire bonding, to an electrode of the semiconductor laser element 12 at a rear end portion in the alignment of the plurality of semiconductor laser elements 12 connected in series. Note that a method for electrically connecting the sheet-like conductor 48 of the element connecting portion 44 to the electrode of the semiconductor laser element 12 is not limited to a method based on wire bonding, and various methods can be used.

The external connecting portion 46 of each of the terminal units 20 and 22 is provided on the element connecting portion 44. The external connecting portion 46 of each of the terminal units 20 and 22 includes a columnar conductor 50 formed into a columnar shape perpendicular to the base plate portion 24, for example. The columnar conductor 50 in each of the terminal units 20 and 22 is electrically connected to the sheet-like conductor 48. Each of the columnar conductors 50 includes in an upper end thereof a female screw hole 52 open upward. As described later, each of the female screw holes 52 is used for electrical connection to the outside. In this way, the external connecting portion 46 of each of the terminal units 20 and 22 is provided upward on the base plate portion 24. In other words, the external connecting portion 46, which is a part of each of the terminal units 20 and 22, is provided on an opposite side to a placement surface, on which the base plate portion 24 is placed and fixed, to extend in an opposite direction to the placement surface. Note that "upward on the base plate portion 24" may include "upward on the base plate portion 24 in the direction orthogonal to the base plate portion 24" as well as "upward on the base plate portion 24 in a direction inclined by a predetermined inclination angle with respect to a direction orthogonal to the base plate portion 24". In other words, an upward direction from the base plate portion 24 may be not only a direction orthogonal to the base plate portion 24 but also a direction inclined by a predetermined inclination angle with respect to the direction orthogonal to the base plate portion 24.

The external connecting portion 46 of each of the terminal units 20 and 22 can be electrically connected to the outside by using a screw or a screw portion screwed into the female screw hole 52. For example, a busbar, which is a conducting bar, is fixed to the external connecting portion 46 while being brought into contact with the columnar conductor 50, by a screw screwed into the female screw hole 52, and the external connecting portion 46 can be electrically connected to the outside via the fixed busbar. Further, by using an external terminal including a male screw portion screwed into the female screw hole 52, the male screw portion of the external terminal is screwed and fixed into the female screw hole 52, whereby the external connecting portion 46 can be electrically connected to the outside via the fixed external terminal. Further, an external terminal, which is a circular or tip-opened crimping terminal, for example, is fixed to the external connecting portion 46 while being brought into contact with the columnar conductor 50, by a male screw screwed into the female screw hole 52, whereby the external connecting portion 46 can be electrically connected to the outside via the fixed external terminal.

The optical system 14 is provided on one side of the alignment of the plurality of semiconductor laser elements 12. The optical system 14 includes a plurality of groups of collimating lenses 58 and 60 and reflecting mirrors 62, as optical elements constituting the optical system 14. The plurality of groups of the collimating lenses 58 and 60 and the reflecting mirrors 62 are placed on the upper surface of the base plate portion 24 and the upper surfaces of the plurality of steps 40 of the stepped portion 38 so as to correspond to the plurality of semiconductor laser elements 12. The plurality of collimating lenses 58 are the same lenses having the same optical characteristic. The plurality of collimating lenses 60 are the same lenses having the same optical characteristic. The plurality of reflecting mirrors 62 are the same having the same optical characteristic. The optical elements constituting the optical system 14 are not limited to the collimating lenses 58 and 60 and the reflecting mirror 62, and the optical system 14 can be constituted by using other optical elements.

In each group of the collimating lenses 58 and 60 and the reflecting mirror 62, the collimating lenses 58 and 60 are successively arranged on the output side of laser light of the corresponding semiconductor laser element 12. The reflecting mirror 62 is arranged in a stage rear of the collimating lens 60. The collimating lenses 58 and 60 each collimate laser light, which is output from the corresponding semiconductor laser element 12, in a vertical direction and a lateral direction and cause the laser light to be parallel light. The reflecting mirror 62 reflects the laser light collimated by the corresponding collimating lenses 58 and 60 by 90° toward the front, and leads the laser light toward the front of the base plate portion 24 provided with the output unit 18.

The output unit 18 is provided on the upper surface of the front end portion of the base plate portion 24. The condenser lens 64 is provided between the output unit 18 and the optical system 14. The output unit 18 includes an optical fiber 68 for outputting laser light, and is configured to output laser light through the optical fiber 68. Note that a length of the optical fiber 68 can be appropriately changed according to design.

The optical fiber 68 of the output unit 18 includes a fixed end, which is one end fixed to the upper surface of the base plate portion 24, and an output end, which is one end drawn out to the outside of the base plate portion 24. The condenser lens 64 constitutes, together with the optical system 14, an optical system for causing laser light output from the plurality of semiconductor laser elements 12 to be incident on the fixed end of the optical fiber 68. The condenser lens 64 condenses laser light, reflected by each of the plurality of reflecting mirrors 62, into the fixed end of the optical fiber 68 and causes the laser light to be incident on the fixed end. The laser light incident on the fixed end of the optical fiber 68 propagates through the optical fiber 68 and is output from the output end of the optical fiber 68 as an output of the laser device 10. Note that the configuration of the optical system for causing laser light to be incident on the fixed end of the optical fiber 68 may include a plurality of condenser lenses including the condenser lens 64, or may include various filters.

Through-holes 70 and 72, through which fixing screws pass, are respectively provided at the front end portion and the rear end portion of the base plate portion 24. The through-holes 70 and 72 are located diagonally to each other. Through-holes 74 and 76, through which fixing screws pass, are provided in a top plate 36 of a lid portion 26 described later, respectively corresponding to the through-holes 70 and 72 provided in the base plate portion 24.

As described later, for example, a plurality of the laser devices 10 according to the present embodiment are aligned on a substrate and used as a light-source device. A placement surface of the substrate, on which the laser devices 10 are aligned, has female screw holes into which fixing screws, which are male screws, are screwed. The laser device 10 is attached and fixed to the placement surface of the substrate by the fixing screw passing through the through-holes 70 and 74 and being screwed into the female screw hole provided in the substrate and the fixing screw passing through the through-holes 72 and 76 and being screwed into the female screw hole provided in the substrate. Note that a method for fixing the laser device 10 to the placement surface of the substrate is not particularly limited, and various methods such as a method using a bolt and a nut and a method using an adhesive can be used in addition to the method using a fixing screw.

In this way, the laser device 10 according to the present embodiment is constituted.

During operation of the laser device 10 according to the present embodiment, a driving current is applied to each of the plurality of semiconductor laser elements 12, connected in series, by the external driving power sources electrically connected to the terminal units 20 and 22. When the driving current is applied, each of the semiconductor laser elements 12 performs laser oscillation and then outputs laser light. The laser light output from each of the semiconductor laser elements 12 is collimated by the corresponding collimating lenses 58 and 60, and then reflected by the corresponding reflecting mirror 62 and led to the condenser lens 64. The laser light reflected by each of the reflecting mirrors 62 is condensed by the condenser lens 64 and incident on the fixed end of the optical fiber 68 of the output unit 18. The laser light incident on the fixed end of the optical fiber 68 is output from the output end of the optical fiber 68 as an output of the laser device 10.

As described above, in the laser device 10 according to the present embodiment, the plurality of semiconductor laser elements 12 and the optical system 14 including the optical elements are placed on the mount surfaces including the upper surface of the base plate portion 24 and the upper surfaces of the plurality of steps 40 in the stepped portion 38. The upper surface of the base plate portion 24 and the upper surfaces of the plurality of steps 40, which are the mount surfaces as such, are open surfaces, and the upper and lateral sides of the semiconductor laser elements 12, the optical system 14, the terminal units 20 and 22, and the like on the respective upper surfaces are not covered and are exposed. Thus, laser light output from the plurality of semiconductor laser elements 12 can be easily observed in a module in the laser device 10 according to the present embodiment. Therefore, in the laser device 10 according to the present embodiment aligning can be easily performed, for the optical fiber 68 of the output unit 18, on laser light that is output from each of the semiconductor laser elements 12 and then successively passes through the collimating lenses 58 and 60, the reflecting mirror 62, and the condenser lens 64. Also in the laser device 10 according to the present embodiment, the terminal units 20 and 22 electrically connected to the electrodes of the semiconductor laser elements 12 are provided on the upper surface of the base plate portion 24. The output unit 18 including the optical fiber 68 for outputting laser light is also provided on the upper surface of the base plate portion 24. Thus, in the laser device 10 according to the present embodiment, the semiconductor laser elements 12 housed in a housing 16 does not need to be electrically connected or optically and positionally aligned to a member provided on a side wall portion of the housing 16 during assembly of a package of the laser device 10. Therefore, the laser device 10 according to the present embodiment is easily assembled and can be manufactured at a low cost.

Furthermore, the terminal units 20 and 22 include the female screw holes 52 and are electrically connected to the outside by screws in the laser device 10 according to the present embodiment. Thus, dissimilar to a case where a lead pin is used, soldering is not needed in the laser device 10 according to the present embodiment. Therefore, the laser device 10 according to the present embodiment can secure excellent workability for electrical connection to the outside.

Also in the laser device 10 according to the present embodiment, the external connecting portions 46 of the terminal units 20 and 22 protrude upward through the top plate 36, namely, to the outside of the housing 16 partially. In the laser device 10 according to the present embodiment, with the external connecting portions 46 protruding in such a manner, electrical connection to the outside can be performed at a high degree of workability through the use of, for example, a busbar that allows easy connection operation.

Furthermore, in the laser device 10 according to the present embodiment, a lead pin implemented with expensive hermetic sealing does not need to be used. Therefore, with the laser device 10 according to the present embodiment, further cost reduction can be achieved.

In this way, according to the present embodiment, the laser device 10 that is easily assembled and can be manufactured at a low cost can be achieved.

Figure 2A:
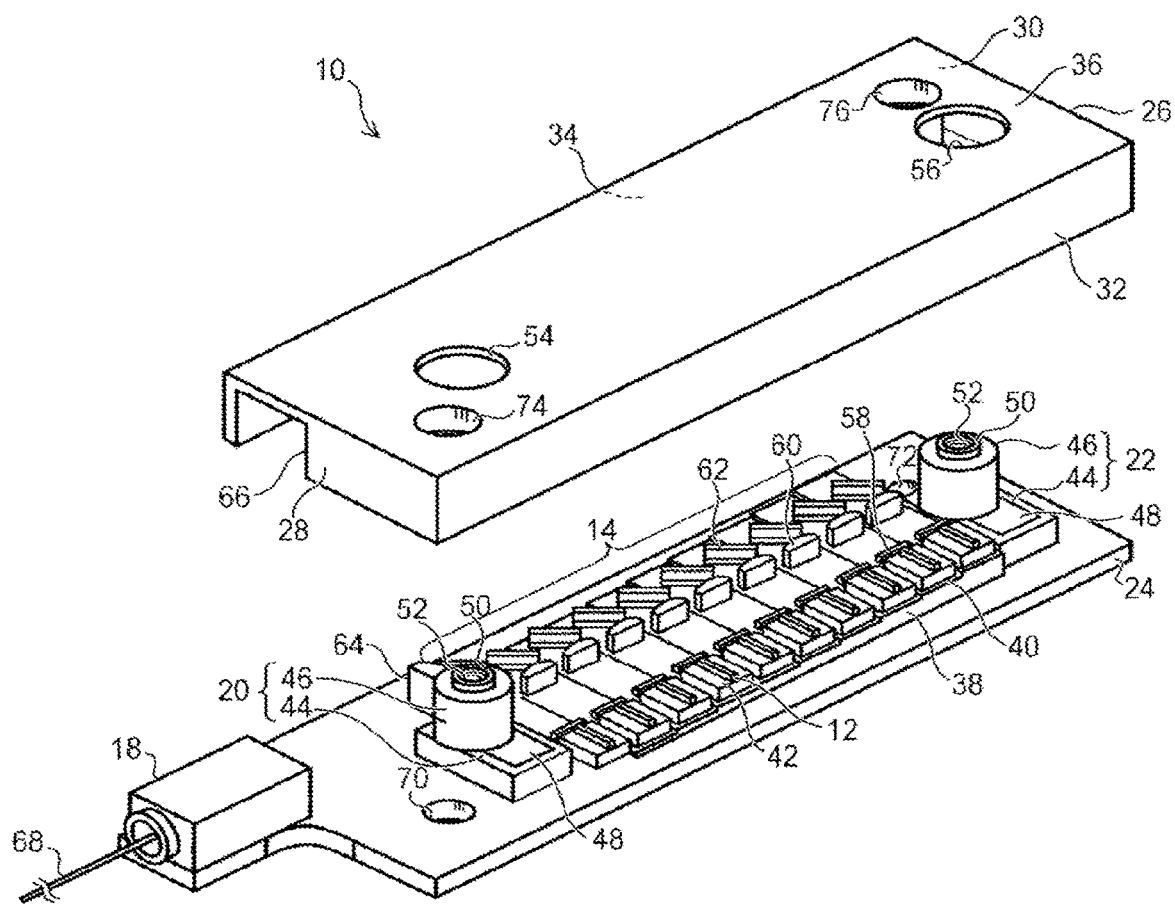
FIG. 2A is a schematic view illustrating attachment of a lid portion of the laser device according to the first embodiment of the disclosure.
Figure 2B:
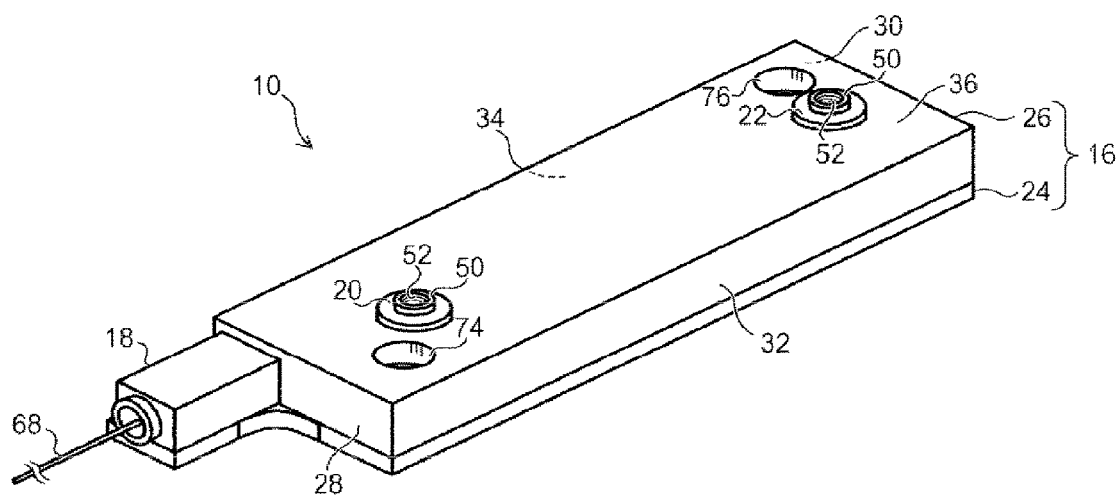
FIG. 2B is a schematic view illustrating attachment of the lid portion of the laser device according to the first embodiment of the disclosure.

For the laser device 10 according to the present embodiment, a lid portion can be attached and fixed to the upper surface of the base plate portion 24 so as to cover the plurality of semiconductor laser elements 12, the optical system 14, and the like placed on the upper surface of the base plate portion 24, with a space left therein. Attachment of the lid portion of the laser device 10 according to the present embodiment will be described using FIG. 2A and FIG. 2B. FIG. 2A is a perspective view illustrating the laser device 10 according to the present embodiment before the lid portion 26 is attached thereto, and also illustrating the lid portion 26 before the attachment. FIG. 2B is a perspective view illustrating the laser device 10 according to the present embodiment after the lid portion 26 is attached thereto.

As illustrated in FIG. 2A and FIG. 2B, the lid portion 26 includes a front side wall portion 28 and a rear side wall portion 30 facing each other in the length direction of the base plate portion 24 and a left side wall portion 32 and a right side wall portion 34 facing each other in the short-side direction of the base plate portion 24. The lid portion 26 further includes the top plate 36 provided on the side wall portions 28, 30, 32, and 34 to face the base plate portion 24. A notch portion 66, to which the output unit 18 is fit, is provided in the front side wall portion 28. Note that the front side wall portion 28, the rear side wall portion 30, the left side wall portion 32, the right side wall portion 34, and the top plate 36 constituting the lid portion 26 may be integrally formed, or may be separate members to be joined together with an adhesive, by soldering, and the like. The lid portion 26 may cover the whole or a part of the space including the semiconductor laser elements 12 and the optical system 14 on the upper surface of the base plate portion 24.

The lid portion 26 is attached and fixed to the upper surface of the base plate portion 24 so as to cover the plurality of semiconductor laser elements 12, the optical system 14, and the like provided on the upper surface of the base plate portion 24, with an inner space left therein. Note that the lid portion 26 is fixed to the upper surface of the base plate portion 24 with an adhesive, by screwing, soldering, and the like, for example. The lid portion 26 is attached and fixed to the base plate portion 24, and thus constitutes together with the base plate portion 24 the housing 16. The housing 16 obtained by fixing the lid portion 26 to the base plate portion 24 in such a manner is not provided with hermetic sealing and is in a state without being hermetically sealed. The lid portion 26 includes a dustproof function of preventing an entry of dust into the housing 16 and light-shielding function of intercepting a leak of light to the outside of the housing 16 and an entry of light into the housing 16. The housing 16 constituted by the base plate portion 24 and the lid portion 26 has a flat and substantially cuboid shape, for example. Note that the shape of the housing 16 is not particularly limited, and various shapes can be adopted.

Openings 54 and 56 are provided in the top plate 36 of the lid portion 26, respectively corresponding to the external connecting portions 46 of the terminal units 20 and 22. With the lid portion 26 fixed to the upper surface of the base plate portion 24, the external connecting portions 46 of the terminal units 20 and 22 protrude upward through the top plate 36, namely, to the outside of the housing 16 partially via the openings 54 and 56 provided in the top plate 36, respectively. In this way, the external connecting portions 46 of the terminal units 20 and 22 protrude from the upper surface of the housing 16 to the outside of the housing 16 partially. Each of the external connecting portions 46 protruding to the outside of the housing 16 partially includes the female screw hole 52 facing upward.

As described above, the through-holes 74 and 76, through which the fixing screws for attaching and fixing the laser device 10 to the placement surface of the substrate pass, are provided in the top plate 36 of the lid portion 26, respectively corresponding to the through-holes 70 and 72 provided in the base plate portion 24.

In this way, in the laser device 10 according to the present embodiment, the lid portion 26 can be attached and fixed to the upper surface of the base plate portion 24.

When the lid portion 26 is attached to the laser device 10 as described above, materials constituting the base plate portion 24 and the lid portion 26 may be materials of the same kind or different kinds, and may be metal and resin, for example. For example, the base plate portion 24 may be made of metal, while the lid portion 26 may be made of resin. However, a material constituting the base plate portion 24 preferably has heat conductivity higher than that of a material constituting the lid portion 26, namely, a material constituting the top plate 36, the front side wall portion 28, the rear side wall portion 30, the left side wall portion 32, and the right side wall portion 34. In other words, the base plate portion 24 preferably has heat conductivity higher than heat conductivity of the lid portion 26. In this way, by relatively increasing heat conductivity of the base plate portion 24 provided with the semiconductor laser elements 12 that generates heat and also reducing heat conductivity of the lid portion 26 to be lower than the heat conductivity of the base plate portion 24, an excellent heat radiating characteristic can be acquired while a rise in product cost can be suppressed.

Figure 3A:
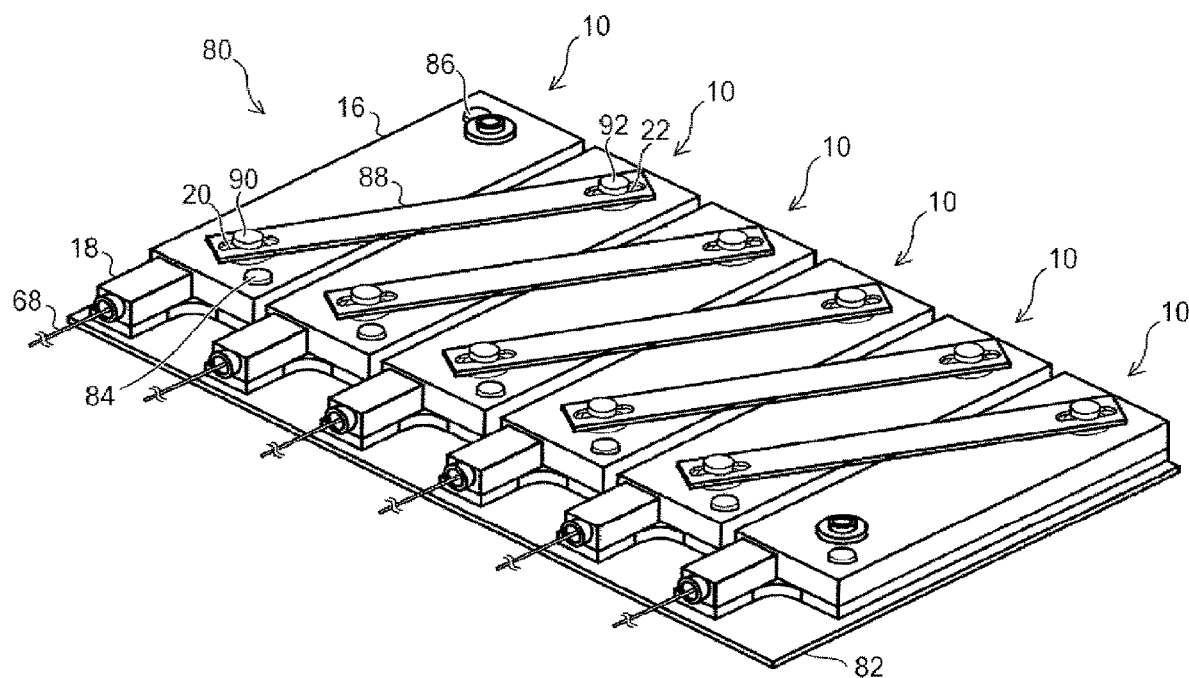
FIG. 3A is a schematic view illustrating a light-source device according to the first embodiment of the disclosure.
Figure 3B:
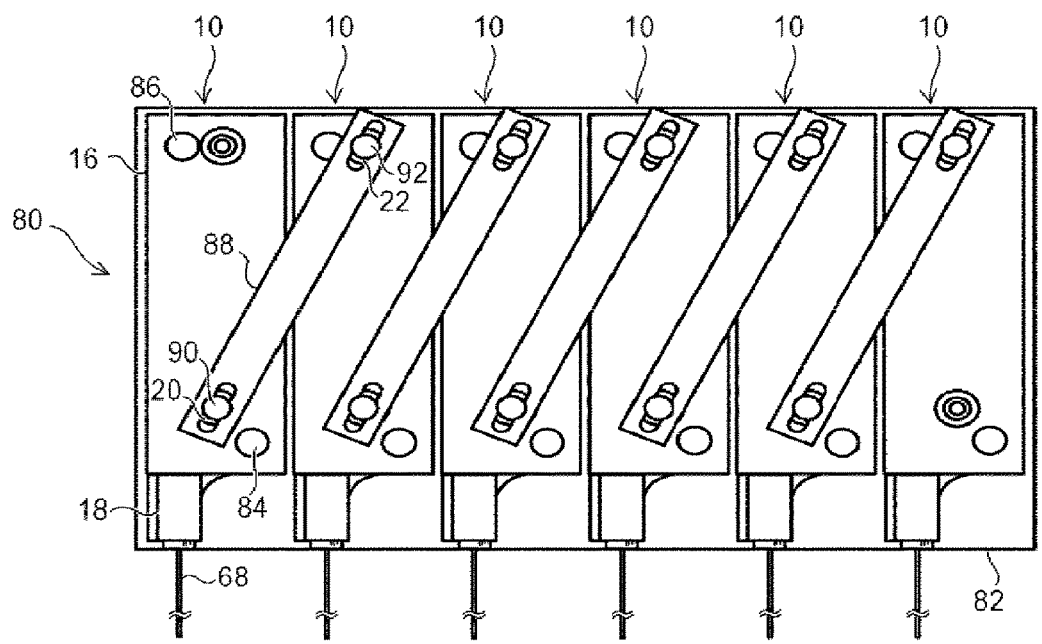
FIG. 3B is a schematic view illustrating the light-source device according to the first embodiment of the disclosure.

A light-source device can be constituted by aligning a plurality of the laser devices 10 according to the present embodiment. By using the plurality of laser devices 10, the light-source device of higher power can be obtained. A light-source device according to the present embodiment in which the plurality of laser devices 10 are aligned will be described below using FIG. 3A and FIG. 3B. FIG. 3A is a perspective view illustrating the light-source device according to the present embodiment. FIG. 3B is a plan view illustrating the light-source device according to the present embodiment. The light-source device constituted by using the laser device 10, to which the lid portion 26 is attached, will be described in the present embodiment. Note that, when the light-source device is constituted, the lid portion 26 may not be attached to the laser device 10. The light-source device constituted by using the laser device 10, to which the lid portion 26 is not attached, will be described in a second embodiment.

As illustrated in FIG. 3A and FIG. 3B, a light-source device 80 according to the present embodiment includes a substrate 82 and the plurality of laser devices 10 aligned and placed on the substrate 82. The lid portion 26 is attached and fixed to the upper surface of the base plate portion 24 as described above in each of the laser devices 10. Note that the number of the plurality of laser devices 10 is not particularly limited, and may be appropriately set according to laser output and the like required for the light-source device 80.

The substrate 82 is a base member that includes a placement surface, on which the plurality of aligned laser devices 10 are placed, and supports the plurality of laser devices 10 placed on the placement surface. Each of the plurality of laser devices 10 is attached and fixed to the placement surface of the substrate 82, with the base plate portion 24 side thereof being on the substrate 82 side. As described above, each of the laser devices 10 is attached and fixed to the placement surface of the substrate 82 by a fixing screw 84 passing through the through-holes 70 and 74 and being screwed into the female screw hole of the substrate 82 and a fixing screw 86 passing through the through-holes 72 and 76 and being screwed into the female screw hole of the substrate 82. Note that the base member on which the plurality of laser devices 10 are placed is not limited to a plate member like the substrate 82, and various shapes can be adopted. For example, the base member, on which the plurality of laser devices 10 are placed, may function as a heat radiating member like a heat sink. In this case, the base member may include a plurality of fins in order to improve heat radiation, for example.

The plurality of laser devices 10 placed on the placement surface of the substrate 82 are aligned in one line in the lateral direction, with the length direction of the substrate 82 being an alignment direction, for example. The plurality of laser devices 10 aligned in one line include the output units 18 facing toward the same side of the alignment. Each of the plurality of laser devices 10 is arranged such that the length direction of the base plate portion 24, namely, the length direction of the housing 16 thereof is orthogonal to the alignment direction of the plurality of laser devices 10. Note that an inclination angle of the laser device 10 to the alignment direction is not particularly limited, and may be appropriately set. Further, the two laser devices 10 adjacent to each other may be aligned, with side end portions of the base plate portion 24 and the lid portion 26 being closely bonded together, or may be aligned with a fixed interval therebetween.

Of the two adjacent laser devices 10, the terminal unit 20 of one of the laser devices 10 and the terminal unit 22 of the other laser device 10 are electrically connected to each other with a busbar 88, which is a conducting bar. One end of the busbar 88 is fixed to the terminal unit 20 of one of the laser devices 10 and electrically connected to the terminal unit 20 by a fixing screw 90 screwed into the female screw hole 52 of the terminal unit 20. The other end of the busbar 88 is fixed to the terminal unit 22 of the other laser device 10 and electrically connected to the terminal unit 22 by a fixing screw 92 screwed into the female screw hole 52 of the terminal unit 22. In this way, the plurality of laser devices 10 are connected in series. Note that a method for electrically connecting the plurality of laser devices 10 is not limited to the method using the busbar 88, and various methods such as a method using a lead line can be used.

In this way, the light-source device 80 according to the present embodiment is constituted.

As described above, the laser device 10 according to the present embodiment can be manufactured at a low cost, and thus the light-source device 80 using the plurality of laser devices 10 can also be manufactured at a low cost.

As described above, in the laser device 10 according to the present embodiment, the terminal units 20 and 22 that can be electrically connected to the outside are provided upward on the base plate portion 24 placed on the placement surface of the substrate 82. Thus, when the plurality of laser devices 10 are aligned in the lateral direction as illustrated in FIG. 3A and FIG. 3B, for example, to constitute the light-source device 80, space does not need to be secured for the terminal units 20 and 22, and a footprint of the light-source device 80 can be reduced. In this way, space saving can be achieved.

Figure 4:
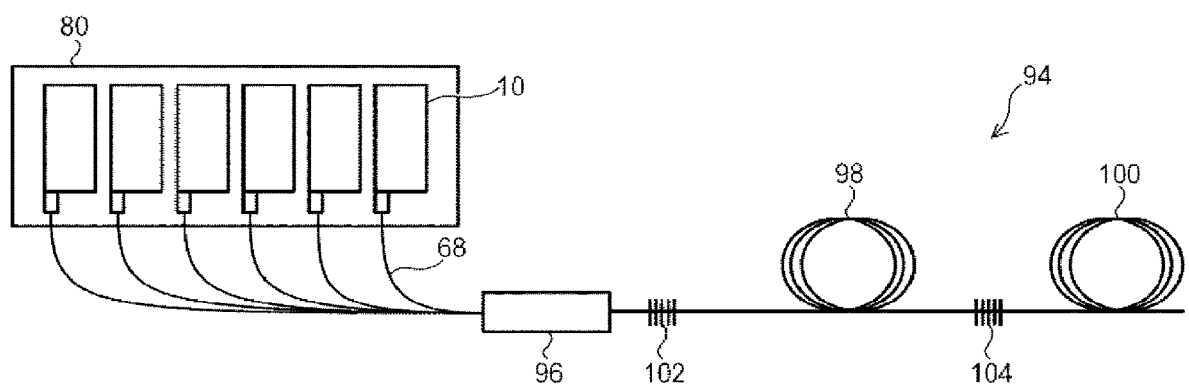
FIG. 4 is a schematic view illustrating an optical fiber laser in which the light-source device according to the first embodiment of the disclosure is used as an excitation light source.

The light-source device 80 according to the present embodiment can be used as, for example, an excitation light source of an optical fiber laser. Herein, an optical fiber laser, in which the light-source device 80 according to the present embodiment is used as an excitation light source, is described using FIG. 4. FIG. 4 is a schematic view illustrating the optical fiber laser, in which the light-source device 80 according to the present embodiment is used as an excitation light source.

As illustrated in FIG. 4, an optical fiber laser 94, in which the light-source device 80 according to the present embodiment is used as an excitation light source, includes the light-source device 80 as an excitation light source and a pump combiner 96 as an optical coupling portion. The optical fiber laser 94 further includes a rare-earth doped optical fiber 98 as an optical fiber for amplification and an output-side optical fiber 100. An input end and an output end of the rare-earth doped optical fiber 98 are respectively provided with a high-reflection fiber bragg grating (FBG) 102 and a low-reflection FBG 104.

The output ends of the optical fibers 68 of the output units 18 in the plurality of laser devices 10 included in the light-source device 80 are coupled to a plurality of respective input imports of the pump combiner 96 having a plurality of inputs and one output. The input end of the rare-earth doped optical fiber 98 is connected to an output port of the pump combiner 96. An input end of the output-side optical fiber 100 is connected to the output end of the rare-earth doped optical fiber 98. Note that, in place of the pump combiner 96, another configuration can also be used for an incidence unit that causes laser light output from the plurality of laser devices 10 to be incident on the rare-earth doped optical fiber 98. For example, the optical fibers 68 of the output units 18 in the plurality of laser devices 10 may be aligned, and laser light output from the plurality of optical fibers 68 may be incident on the input end of the rare-earth doped optical fiber 98 by using an incidence unit such as an optical system including a lens.

In this way, the optical fiber laser 94, in which the light-source device 80 according to the present embodiment is used as an excitation light source, is constituted.

In the optical fiber laser 94, laser light output from the optical fibers 68 of the plurality of laser devices 10 is combined by the pump combiner 96 and output from the output port of the pump combiner 96. The pump combiner 96 as an incidence unit causes laser light as excitation light output from the output port thereof to be incident on the input end of the rare-earth doped optical fiber 98. In the rare-earth doped optical fiber 98, the high-reflection FBG 102 and the low-reflection FBG 104 form a resonator including the rare-earth doped optical fiber 98.

In the rare-earth doped optical fiber 98 as an optical fiber for amplification, excitation light that propagates is absorbed in a rare-earth element doped in a core, an inverted distribution is generated between a ground level and a metastable level, and light is then radiated. The light radiated in such a manner performs laser oscillation by action of optical amplification of the rare-earth doped optical fiber 98 and action of the laser resonator constituted by the high-reflection FBG 102 and the low-reflection FBG 104. In this way, laser light is generated by laser oscillation. The generated laser light is output from an output end of the output-side optical fiber 100 connected to the output end of the rare-earth doped optical fiber 98.

Second Embodiment

A laser device and a light-source device according to a second embodiment of the disclosure will be described using FIG. 5 to FIG. 7. Note that components similar to those of the laser device and the light-source device according to the first embodiment described above are denoted by the same reference signs, and description thereof will be omitted or simplified.

The configuration of the laser device according to the present embodiment is similar to that of the laser device 10 according to the first embodiment. The light-source device constituted by using the laser device 10, to which the lid portion 26 is not attached, will be described in the present embodiment.

First, the configuration of the light-source device according to the present embodiment will be described using FIG. 5. FIG. 5 is a perspective view illustrating the light-source device according to the present embodiment.

Figure 5:
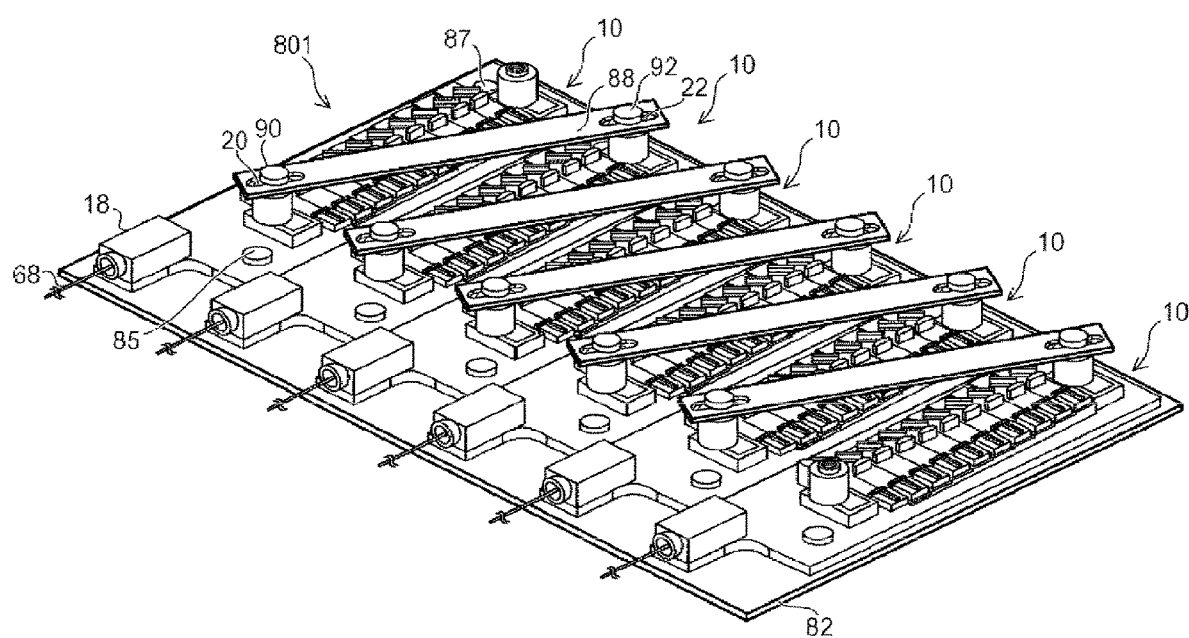
FIG. 5 is a perspective view illustrating a light-source device according to a second embodiment of the disclosure.

As illustrated in FIG. 5, a light-source device 801 according to the present embodiment includes the substrate 82 and the plurality of laser devices 10 aligned and placed on the substrate 82, similarly to the light-source device 80 according to the first embodiment. However, in the light-source device 801 according to the present embodiment, the lid portion 26 is not attached to each of the laser devices 10, and the semiconductor laser elements 12, the optical system 14, and the like are exposed. The two laser devices 10 adjacent to each other are aligned, with the side end portions of the base plate portion 24 being closely bonded to each other. Note that the two laser devices 10 adjacent to each other may be aligned with a fixed interval therebetween. Further, each of the laser devices 10 is attached and fixed to the placement surface of the substrate 82 by fixing screws 85 and 87 that pass though the through-holes 70 and 72 provided in the base plate portion 24 and are screwed into the female screw holes of the substrate 82.

Also in the light-source device 801 according to the present embodiment, in which the lid portion 26 is not attached to each of the laser devices 10, the plurality of laser devices 10 are connected in series with the busbar 88, similarly to the light-source device 80 according to the first embodiment. In other words, of the two adjacent laser devices 10, the terminal unit 20 of one of the laser devices 10 and the terminal unit 22 of the other laser device 10 are electrically connected to each other with the busbar 88. The one end of the busbar 88 is fixed to the terminal unit 20 of one of the laser devices 10 and electrically connected to the terminal unit 20 by the fixing screw 90 screwed into the female screw hole 52 of the terminal unit 20. The other end of the busbar 88 is fixed to the terminal unit 22 of the other laser device 10 and electrically connected to the terminal unit 22 by the fixing screw 92 screwed into the female screw hole 52 of the terminal unit 22. Note that, also in the present embodiment, a method for electrically connecting the plurality of laser devices 10 is not limited to the method using the busbar 88, and various methods such as a method using a lead line can be used.

As in the present embodiment, the light-source device 801 can be constituted by using the laser device 10, to which the lid portion 26 is not attached.

For the light-source device 801 according to the present embodiment, a single lid portion can be attached and fixed to the upper surfaces of the base plate portions 24 of the laser devices 10 so as to collectively cover the plurality of semiconductor laser elements 12, the optical system 14, and the like provided on the upper surface of the base plate portion 24 of each of the laser devices 10, with a space left therein. Hereinafter, attachment of the lid portion of the light-source device 801 according to the present embodiment will be described using FIG. 6 and FIG. 7. FIG. 6 is a perspective view illustrating the light-source device 801 according to the present embodiment before a lid portion 226 is attached thereto, and also illustrating the lid portion 226 before the attachment. FIG. 7 is a perspective view illustrating the light-source device 801 according to the present embodiment after the lid portion 226 is attached thereto.

Figure 6:
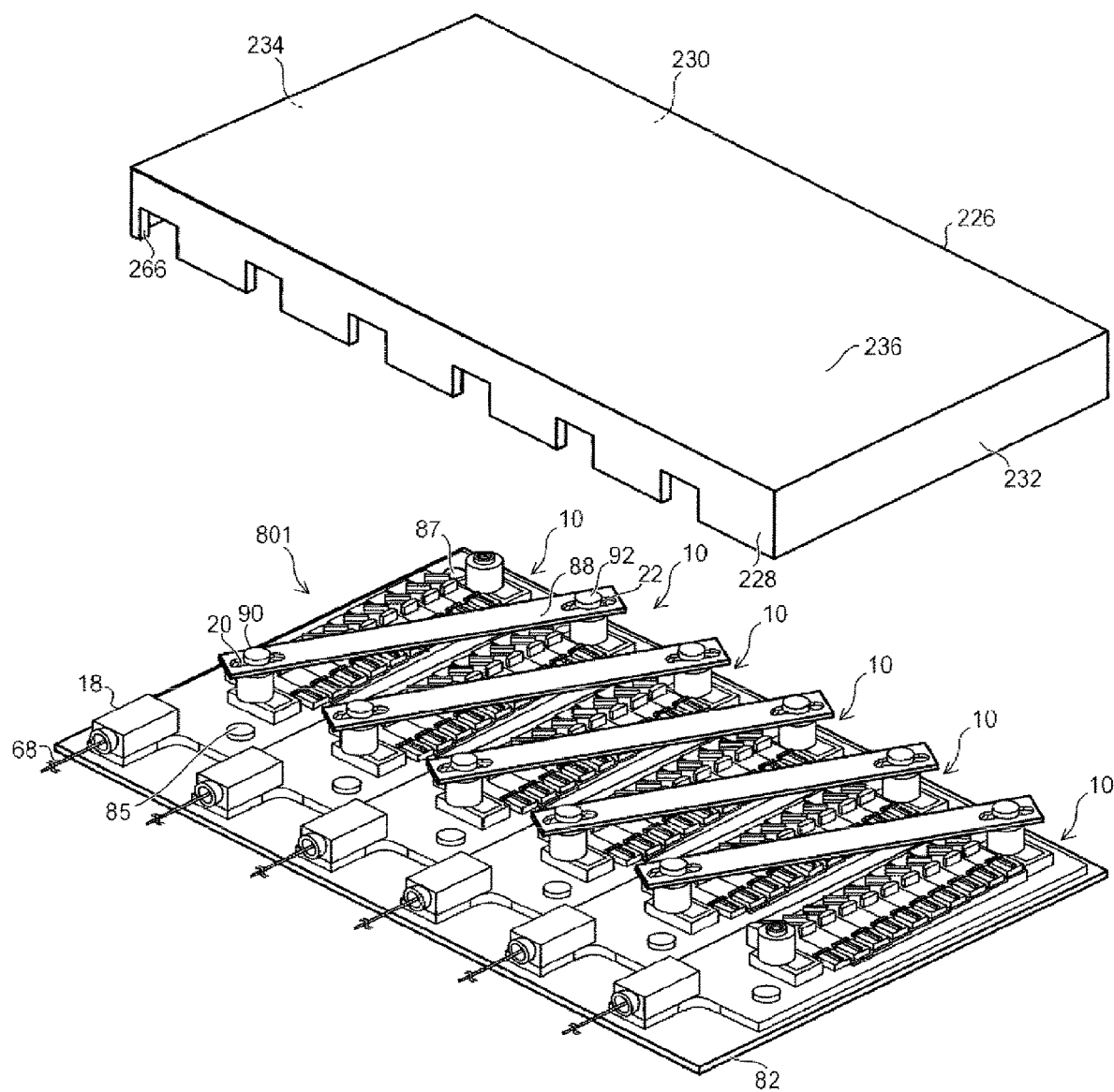
FIG. 6 is a schematic view (part one) illustrating attachment of a lid portion of the light-source device according to the second embodiment of the disclosure.
Figure 7:
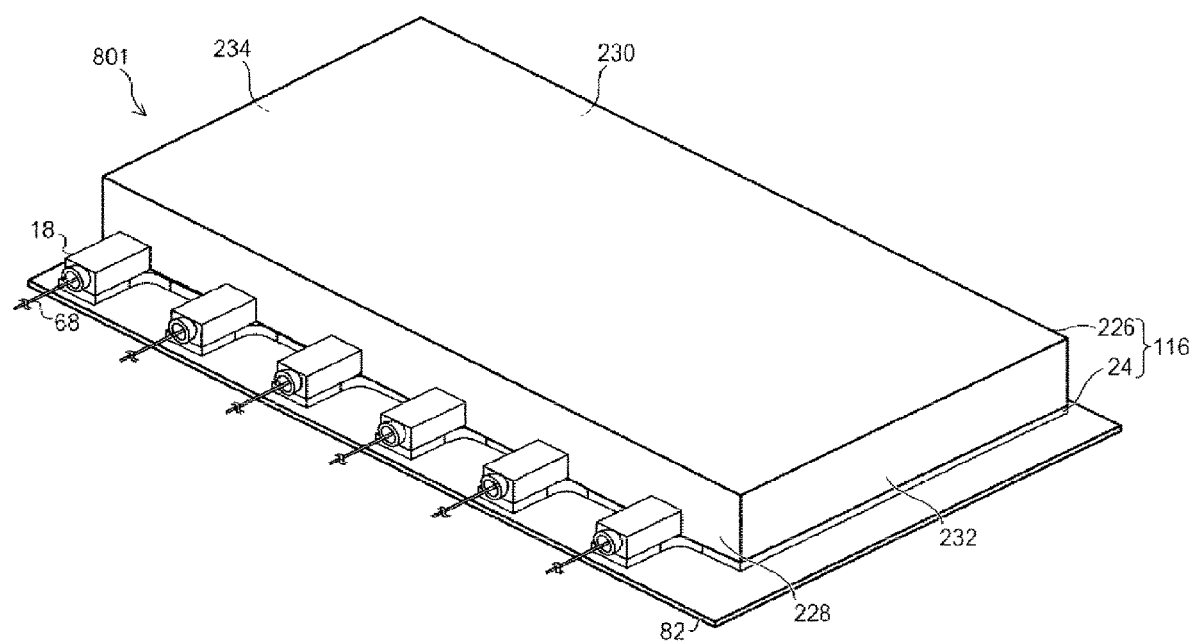
FIG. 7 is a schematic view (part two) illustrating attachment of the lid portion of the light-source device according to the second embodiment of the disclosure.

As illustrated in FIG. 6 and FIG. 7, the lid portion 226 includes a front side wall portion 228 and a rear side wall portion 230 facing each other in the length direction of the base plate portion 24 of each of the laser devices 10 and a left side wall portion 232 and a right side wall portion 234 facing each other in the alignment direction of the plurality of laser devices 10. The lid portion 226 further includes a top plate 236 provided on the side wall portions 228, 230, 232, and 234 to face the base plate portion 24 of each of the laser devices 10. A plurality of notch portions 266, to which the output units 18 of the plurality of laser devices 10 are fit, are provided in the front side wall portion 228. Note that the front side wall portion 228, the rear side wall portion 230, the left side wall portion 232, the right side wall portion 234, and the top plate 236 constituting the lid portion 226 may be integrally formed, or may be separate members to be joined together with an adhesive, by soldering, and the like. The lid portion 226 may cover the whole or a part of the space including the semiconductor laser elements 12 and the optical system 14 on the upper surface of the base plate portion 24 of each of the laser devices 10.

The lid portion 226 is attached and fixed to the upper surfaces of the base plate portions 24 of the laser devices 10 so as to collectively cover the plurality of semiconductor laser elements 12, the optical system 14, and the like provided on the upper surface of the base plate portion 24 of each of the laser devices 10, with a space left therein. The plurality of laser devices 10 are connected in series with the busbar 88 as described above in the lid portion 226. Note that the lid portion 226 is fixed to the upper surface of the base plate portion 24 with an adhesive, by screwing, soldering, and the like, for example. The lid portion 226 is attached and fixed to the base plate portion 24 of each of the laser devices 10, and thus constitutes a housing 116 together with the base plate portions 24 of the laser devices 10. The housing 116 obtained by fixing the lid portion 226 to the base plate portion 24 in such a manner is not implemented with hermetic sealing and is in a state without being hermetically sealed. The lid portion 226 includes a dustproof function of preventing an entry of dust into the housing 116 and light-shielding function of intercepting a leak of light to the outside of the housing 116 and an entry of light into the housing 116. The housing 116 constituted by the base plate portion 24 and the lid portion 226 has a flat and substantially cuboid shape, for example. Note that the shape of the housing 116 is not particularly limited, and various shapes can be adopted.

When the lid portion 226 is attached to the light-source device 801 as described above, materials constituting the base plate portion 24 and the lid portion 226 of each of the laser devices 10 may be materials of the same kind or different kinds, and may be metal and resin, for example. For example, the base plate portion 24 may be made of metal, while the lid portion 226 may be made of resin. However, a material constituting the base plate portion 24 preferably has heat conductivity higher than that of a material constituting the lid portion 226, namely, a material constituting the top plate 236, the front side wall portion 228, the rear side wall portion 230, the left side wall portion 232, and the right side wall portion 234. In other words, the base plate portion 24 preferably has heat conductivity higher than heat conductivity of the lid portion 226. In this way, by relatively increasing heat conductivity of the base plate portion 24 provided with the semiconductor laser elements 12 that generate heat and also reducing heat conductivity of the lid portion 226 to be lower than the heat conductivity of the base plate portion 24, an excellent heat radiating characteristic can be acquired while a rise in product cost can be suppressed.

As in the present embodiment, the lid portion 226 that collectively covers the plurality of semiconductor laser elements 12, the optical system 14, and the like of each of the laser devices 10 can also be provided, instead of attaching the individual lid portion 26 to each of the laser devices 10.

Third Embodiment

A laser device and a light-source device according to a third embodiment of the disclosure will be described using FIG. 8 and FIG. 9. Note that components similar to those of the laser device and the light-source device according to the first and second embodiments described above is denoted by the same reference signs, and description thereof will be omitted or simplified.

The configurations of the laser device and the light-source device according to the present embodiment are similar to those of the laser device 10 and the light-source device 801 according to the second embodiment. In the second embodiment, the description is given of the case where the plurality of laser devices 10 are connected in series in the lid portion 226 when the lid portion 226 covering the semiconductor laser elements 12, the optical system 14, and the like of each of the laser devices 10 in the light-source device 801 is provided. In contrast, a case where the plurality of laser devices 10 in the light-source device are connected in series outside a lid portion will be described in the present embodiment.

Hereinafter, attachment of the lid portion of the light-source device according to the present embodiment will be described using FIG. 8 and FIG. 9. FIG. 8 is a perspective view illustrating a light-source device 802 according to the present embodiment before a lid portion 326 is attached thereto, and also illustrating the lid portion 326, the busbar 88, and the like before the attachment. FIG. 9 is a perspective view illustrating the light-source device 802 according to the present embodiment after the lid portion 326 is attached.

Figure 8:
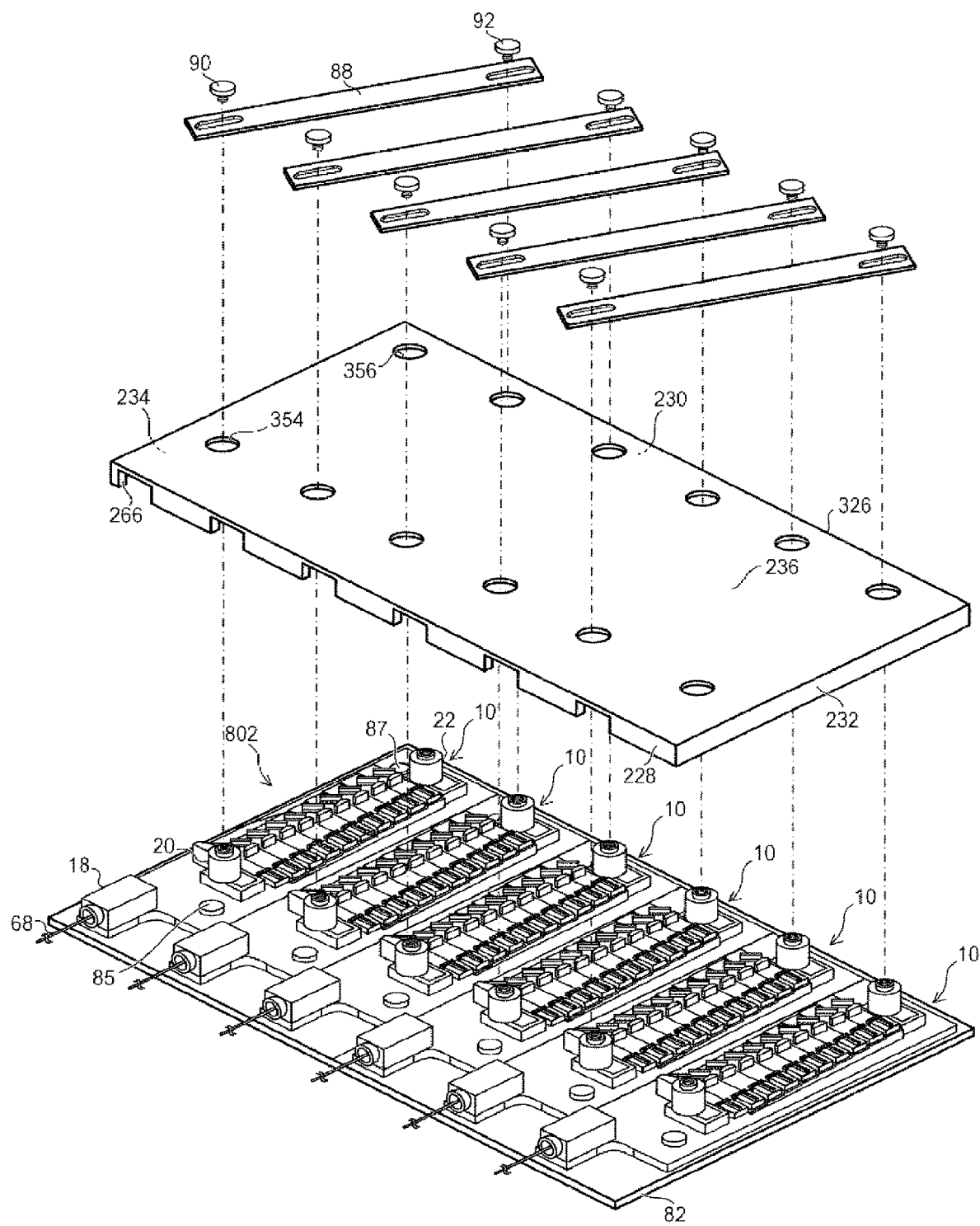
FIG. 8 is a schematic view (part one) illustrating attachment of a lid portion of a light-source device according to a third embodiment of the disclosure.
Figure 9:
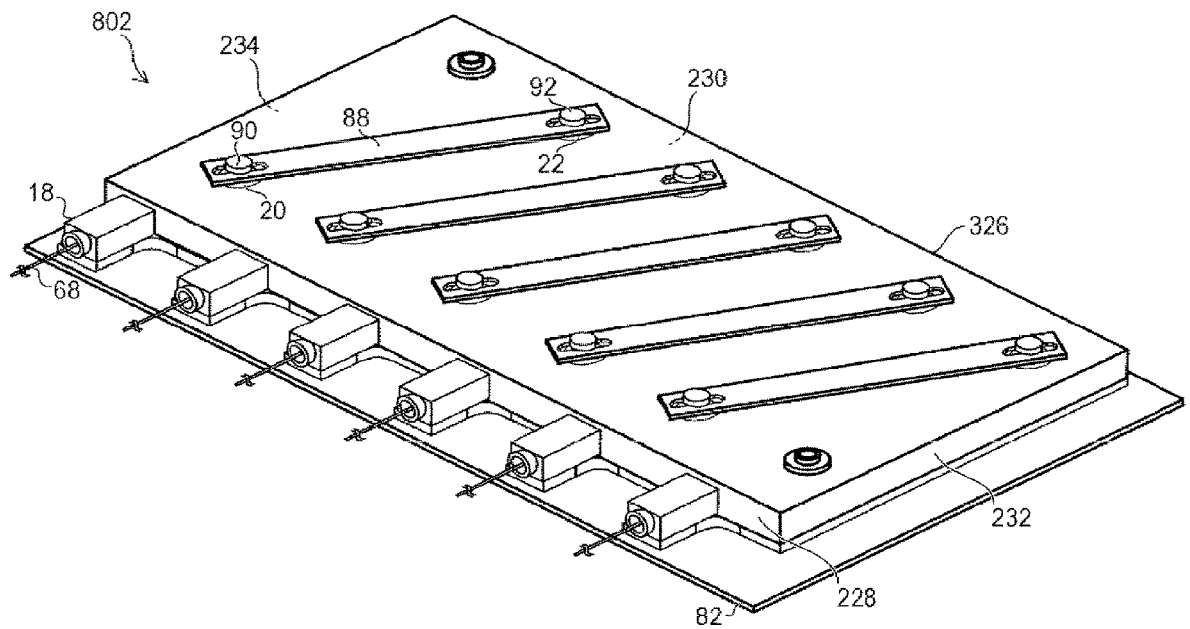
FIG. 9 is a schematic view (part two) illustrating attachment of the lid portion of the light-source device according to the third embodiment of the disclosure.

As illustrated in FIG. 8 and FIG. 9, the lid portion 326 includes the front side wall portion 228, the rear side wall portion 230, the left side wall portion 232, the right side wall portion 234, and the top plate 236, similarly to the lid portion 226 in the second embodiment.

Furthermore, a plurality of groups of openings 354 and 356 are provided in the top plate 236 of the lid portion 326, respectively corresponding to the plurality of groups of the external connecting portions 46 of the terminal units 20 and 22 in the plurality of laser devices 10. With the lid portion 326 fixed to the upper surface of the base plate portion 24 of each of the laser devices 10, the external connecting portions 46 of the terminal units 20 and 22 in each of the laser devices 10 protrude upward through the top plate 236 partially via the corresponding openings 354 and 356 provided in the top plate 236, respectively. In this way, the external connecting portions 46 of the terminal units 20 and 22 in each of the laser devices 10 protrude from the upper surface of the top plate 236 of the lid portion 326 partially to the outside. Each of the external connecting portions 46 protruding to the outside of the lid portion 326 partially includes the female screw hole 52 facing upward.

Also in the light-source device 802 according to the present embodiment in which the external connecting portions 46 of the terminal units 20 and 22 in each of the laser devices 10 protrude to the outside of the lid portion 326 partially, the plurality of laser devices 10 are connected in series with the busbar 88, similarly to the light-source device 80 according to the first embodiment. In other words, of the two adjacent laser devices 10, the terminal unit 20 of one of the laser devices 10 and the terminal unit 22 of the other laser device 10 are electrically connected to each other with the busbar 88 outside the lid portion 326. The one end of the busbar 88 is fixed to the terminal unit 20 of one of the laser devices 10 and electrically connected to the terminal unit 20 by the fixing screw 90 screwed into the female screw hole 52 of the terminal unit 20. The other end of the busbar 88 is fixed to the terminal unit 22 of the other laser device 10 and electrically connected to the terminal unit 22 by the fixing screw 92 screwed into the female screw hole 52 of the terminal unit 22. Note that, also in the present embodiment, a method for electrically connecting the plurality of laser devices 10 is not limited to the method using the busbar 88, and various methods such as a method using a lead line can be used.

As in the present embodiment, the plurality of laser devices 10 may be connected in series outside the lid portion 326.

Fourth Embodiment

A laser device and a light-source device according to a fourth embodiment of the disclosure will be described using FIG. 10 and FIG. 11. Note that components similar to those of the laser device and the light-source device according to the first to third embodiments described above are denoted by the same reference signs, and description thereof will be omitted or simplified.

A basic configuration of the laser device according to the present embodiment is similar to the configuration of the laser device 10 according to the first embodiment. The laser device according to the present embodiment is different from the laser device 10 according to the first embodiment in that the laser device according to the present embodiment includes a fixing portion in place of the through-holes 70 and 72 of the base plate portion 24 for attaching and fixing the laser device 10 to the placement surface of the substrate.

Figure 10:
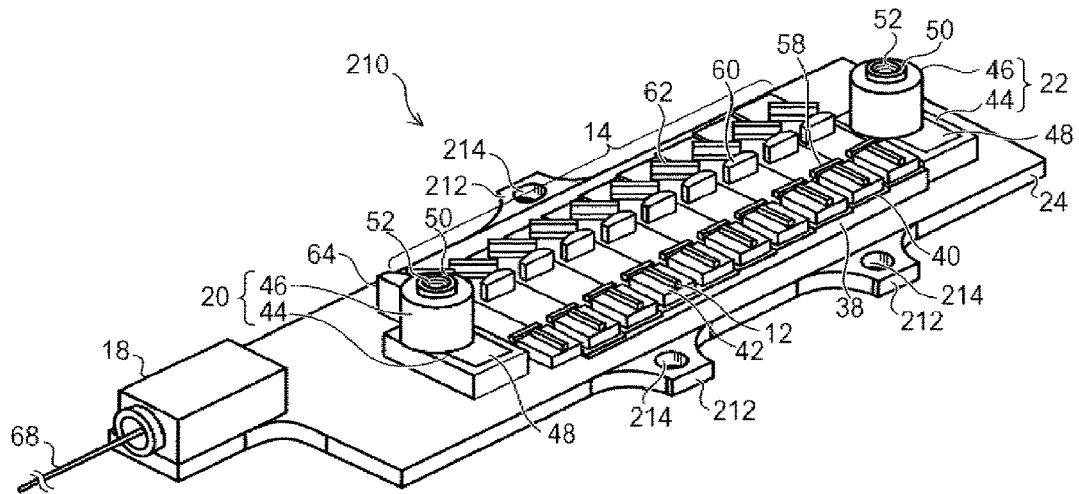
FIG. 10 is a perspective view illustrating a laser device according to a fourth embodiment of the disclosure.

FIG. 10 is a perspective view illustrating the laser device according to the present embodiment. As illustrated in FIG. 10, a laser device 210 according to the present embodiment includes a plurality of fixing portions 212 provided to the base plate portion 24. Note that the through-holes 70 and 72 are not provided in the base plate portion 24 in the laser device 210 according to the present embodiment, unlike the laser device 10 according to the first embodiment.

Each of the fixing portions 212 is provided on the base plate portion 24 to protrude from the base plate portion 24 toward the outside. For example, two fixing portions 212 are provided to one of two edge end portions along the length direction of the base plate portion 24, and one fixing portion 212 is provided to the other. Note that the number and positions of the fixing portions 212 are not particularly limited, and can be appropriately changed.

A through-hole 214, through which a fixing screw passes, is provided in each of the fixing portions 212. For example, a plurality of the laser devices 210 are aligned on a placement surface of a substrate and used as a light-source device, similarly to the laser devices 10. The placement surface of the substrate, on which the laser devices 210 are aligned, has female screw holes into which fixing screws, which are male screws, are screwed. The laser device 210 is attached and fixed to the placement surface of the substrate by the fixing screw that passes through the through-hole 214 of each of the fixing portions 212 and is screwed into the female screw hole provided in the placement surface of the substrate. Note that a method for fixing the laser device 210 to the placement surface of the substrate is not particularly limited, and various methods such as a method using a bolt and a nut can be used in addition to the method using a fixing screw.

Figure 11:
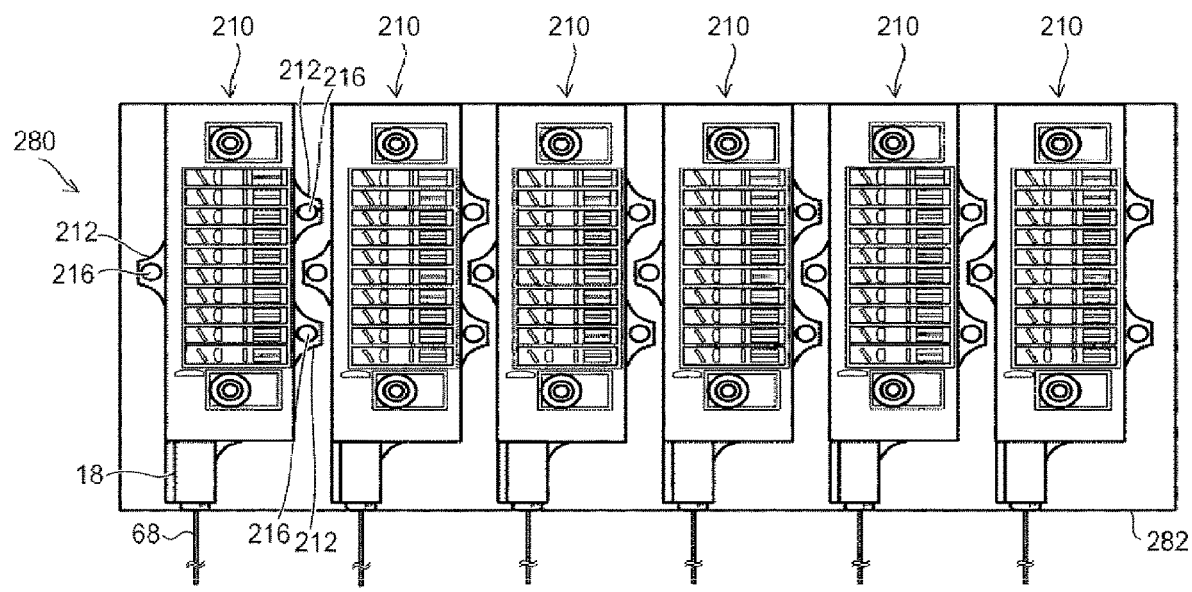
FIG. 11 is a plan view illustrating a light-source device according to the fourth embodiment of the disclosure.

FIG. 11 is a plan view illustrating the light-source device according to the present embodiment. As illustrated in FIG. 11, a light-source device 280 according to the present embodiment includes a substrate 282 and the plurality of laser devices 210 aligned and placed on the substrate 282. Note that the fixing screws 90 and 92 and the busbar 88 electrically connecting the terminal unit 20 and the terminal unit 22 are omitted in FIG. 11.

Each of the plurality of laser devices 210 is attached to the substrate 282, with the base plate portion 24 side thereof being on the substrate 282 side. As described above, each of the laser devices 210 is attached and fixed to the placement surface of the substrate 282 by a fixing screw 216 that passes though the through-hole 214 provided in each of the fixing portions 212 and is screwed into the female screw hole of the substrate 282.

As in the present embodiment, the fixing portion 212 for attaching and fixing the laser device 210 to the placement surface of the substrate 282 may be provided outside the base plate portion 24.

Note that, also in the present embodiment, the lid portion 26 can be attached and fixed to the laser device 210, similarly to the first embodiment. Further, the lid portion 226 or the lid portion 326 can be attached to the light-source device 280, similarly to the second or third embodiment.

Fifth Embodiment

A laser device according to a fifth embodiment of the disclosure will be described using FIG. 12. Note that components similar to those of the laser device and the light-source device according to the first to fourth embodiments described above are denoted by the same reference signs, and description thereof will be omitted or simplified.

A basic configuration of the laser device according to the present embodiment is similar to the configuration of the laser device 210 according to the fourth embodiment. The laser device according to the present embodiment is different from the laser device 210 according to the fourth embodiment in that the laser device according to the present embodiment includes terminal units in which external connecting portions are provided outside the base plate portion 24, in place of the terminal units 20 and 22.

Figure 12:
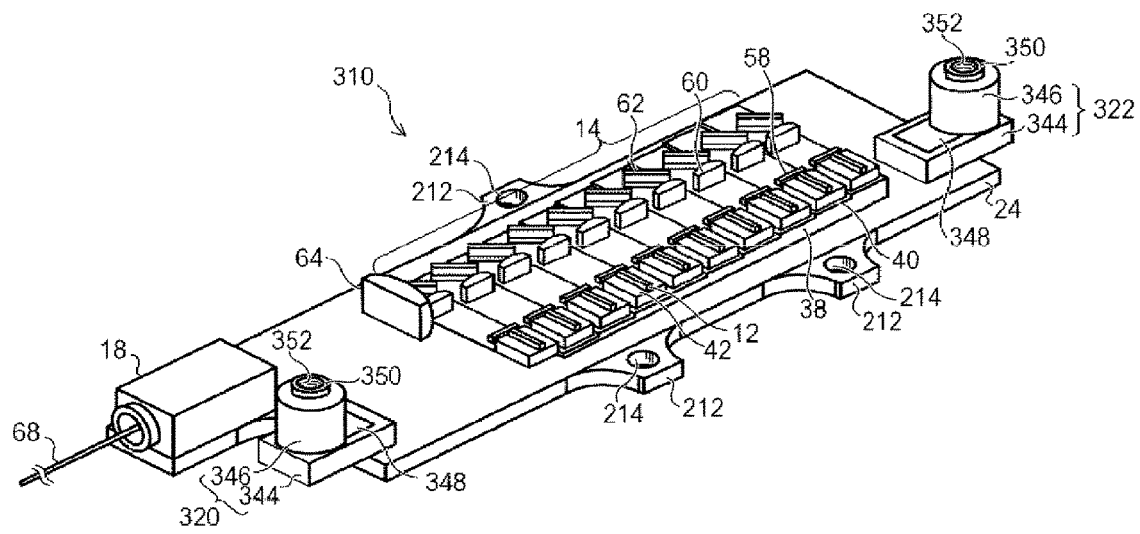
FIG. 12 is a perspective view illustrating a laser device according to a fifth embodiment of the disclosure.

FIG. 12 is a perspective view illustrating the laser device according to the present embodiment. As illustrated in FIG. 12, a laser device 310 according to the present embodiment includes terminal units 320 and 322 in which external connecting portions 346 are provided outside the base plate portion 24, in place of the terminal units 20 and 22.

The terminal unit 320 is provided on a front end portion side of the base plate portion 24. The terminal unit 322 is provided on a rear end portion side of the base plate portion 24. The terminal units 320 and 322 can be electrically connected to the outside, and include functions similar to those of the terminal units 20 and 22, respectively.

The terminal units 320 and 322 each include an element connecting portion 344 and the external connecting portion 346 electrically connected to the element connecting portion 344. The terminal units 320 and 322 each utilize a screw as a connection form when being electrically connected to the outside.

The element connecting portion 344 of the terminal unit 320 is provided on the front end portion of the base plate portion 24 in parallel with the base plate portion 24 protrude toward the front of the base plate portion 24. The element connecting portion 344 of the terminal unit 320 includes a sheet-like conductor 348 similar to the sheet-like conductor 48. This sheet-like conductor 348 is electrically connected, via a wire by wire bonding, to an electrode of the semiconductor laser element 12 at a front end portion in the alignment of the plurality of semiconductor laser elements 12.

The element connecting portion 344 of the terminal unit 322 is provided on the rear end portion of the base plate portion 24 in parallel with the base plate portion 24 to protrude toward the rear of the base plate portion 24. The element connecting portion 344 of the terminal unit 322 includes a sheet-like conductor 348 similar to the sheet-like conductor 48. This sheet-like conductor 348 is electrically connected, via a wire by wire bonding, to an electrode of the semiconductor laser element 12 at a rear end portion in the alignment of the plurality of semiconductor laser elements 12.

Note that a method for electrically connecting the sheet-like conductor 348 of each of the element connecting portions 344 to an electrode of the semiconductor laser element 12 is not limited to a method based on wire bonding, and various methods can be used.

The external connecting portion 346 of each of the terminal units 320 and 322 is provided on a portion of the element connecting portion 344 outside the base plate portion 24. The external connecting portion 346 of each of the terminal units 320 and 322 includes a columnar conductor 350 formed into a columnar shape perpendicular to the base plate portion 24, for example. The columnar conductor 350 in each of the terminal units 320 and 322 is electrically connected to the sheet-like conductor 348 of the element connecting portion 344. Each of the columnar conductors 350 includes, in an upper end thereof, a female screw hole 352 open upward. Hence, the external connecting portion 346 of each of the terminal units 320 and 322 is provided upward on the base plate portion 24, similarly to the external connecting portion 46 of each of the terminal units 20 and 22 in the first embodiment. In other words, the external connecting portion 346, which is a part of each of the terminal units 320 and 322, is provided on an opposite side to a placement surface, on which the base plate portion 24 is placed and fixed, to extend in an opposite direction to the placement surface.

The external connecting portion 346 of each of the terminal units 320 and 322 can be electrically connected to the outside by using a screw or a screw portion screwed into the female screw hole 352, similarly to the external connecting portion 46 of each of the terminal units 20 and 22 described above.

As in the present embodiment, the external connecting portions 346, each of which is a part of the terminal units 320 and 322 that can be electrically connected to the outside, may be provided outside of the base plate portion 24.

It is described above that the terminal units 320 and 322 are provided, in place of the terminal units 20 and 22, in the configuration similar to that of the laser device 210 according to the fourth embodiment, but the configuration is not limited thereto. The terminal units 320 and 322 can also be provided, in place of the terminal units 20 and 22, in the configuration similar to that of the laser device 10 according to the first embodiment.

Further, also in the present embodiment, the lid portion 26 can be attached and fixed to the laser device 310, similarly to the first embodiment. In this case, the openings 54 and 56 do not need to be provided in the lid portion 26. Further, when a light-source device is constituted by using the laser device 310, the lid portion 226 or the lid portion 326 can be attached and fixed to the light-source device 280, similarly to the second or third embodiment.

Sixth Embodiment

A laser device according to a sixth embodiment of the disclosure will be described using FIG. 13. Note that components similar to those of the laser device and the light-source device according to the first to fifth embodiments described above are denoted by the same reference signs, and description thereof will be omitted or simplified.

A basic configuration of the laser device according to the present embodiment is similar to the configuration of the laser device 210 according to the fourth embodiment. The laser device according to the present embodiment is different from the laser device 210 according to the fourth embodiment in that the laser device according to the present embodiment includes, in place of the terminal units 20 and 22, terminal units having a shape and a form of connection to the outside that are different from those of the terminal units 20 and 22.

Figure 13:
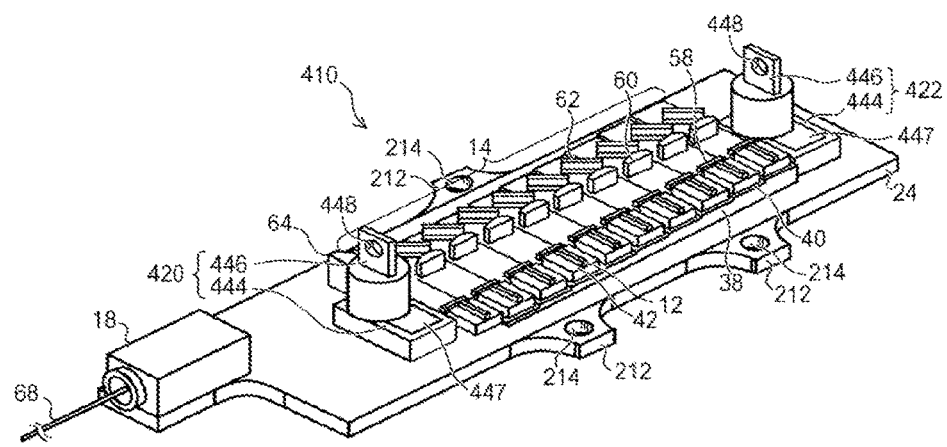
FIG. 13 is a perspective view illustrating a laser device according to a sixth embodiment of the disclosure.

FIG. 13 is a perspective view illustrating the laser device according to the present embodiment. As illustrated in FIG. 13, a laser device 410 according to the present embodiment includes terminal units 420 and 422, in place of the terminal units 20 and 22.

The terminal units 420 and 422 each include an element connecting portion 444 and an external connecting portion 446 electrically connected to the element connecting portion 444. The terminal units 420 and 422 include functions similar to those of the terminal units 20 and 22, respectively. However, the terminal units 420 and 422 have a shape and a form of connection to the outside that are different from those of the terminal units 20 and 22. In other words, the terminal units 420 and 422 each utilize an opening 448 as a connection form, as described below, when being electrically connected to the outside.

The terminal units 420 and 422 each include the external connecting portion 446 protruding from the base plate portion 24 upward. Each of the external connecting portion 446 is constituted by a plate conductor orthogonal to the length direction of the base plate portion 24. Each of the external connecting portions 446 is provided with the opening 448 penetrating therethrough along the length direction of the base plate portion 24.

Each of the external connecting portions 446 is electrically connected to the element connecting portion 444 provided on the upper surface of the base plate portion 24. The element connecting portion 444 is identical to the element connecting portion 44. The element connecting portion 444 includes a sheet-like conductor 447 identical to the sheet-like conductor 48. The external connecting portion 446 is electrically connected to the sheet-like conductor 447.

An external terminal can be electrically connected to the external connecting portion 446 of each of the terminal units 420 and 422 by using the opening 448. For example, an external terminal, i.e., a circular or tip-opened crimping terminal, can be fixed to the external connecting portion 446 by a bolt passing through the opening 448 and a corresponding nut from the side of the external connecting portion 446. In this way, the external terminal can be electrically connected to each of the terminal units 420 and 422.

As in the present embodiment, the terminal units 420 and 422 may be provided that utilize the opening 448 as a connection form, in place of the terminal units 20 and 22 that utilize a screw as a connection form.

It is described above that the terminal units 420 and 422 are provided, in place of the terminal units 20 and 22, in the configuration similar to that of the laser device 210 according to the fourth embodiment, but the configuration is not limited thereto. The terminal units 420 and 422 can also be provided, in place of the terminal units 20 and 22, in the configuration similar to that of the laser device 10 according to the first embodiment. Further, the terminal units 420 and 422 can also be provided, in place of the terminal units 320 and 322, in the configuration similar to that of the laser device 310 according to the fifth embodiment.

Further, also in the present embodiment, the lid portion 26 can be attached and fixed to the laser device 410, similarly to the first embodiment. In this case, openings, through which the external connecting portions 446 of the terminal units 420 and 422 protrude to the outside of the lid portion 26, are provided in the lid portion 26. Further, when a light-source device is constituted by using the laser device 410, the lid portion 226 or the lid portion 326 can be attached and fixed to the light-source device 280, similarly to the second or third embodiment.

Seventh Embodiment

A light-source device according to a seventh embodiment of the disclosure will be described using FIG. 14. Note that components similar to those of the laser device and the light-source device according to the first to sixth embodiments described above are denoted by the same reference signs, and description thereof will be omitted or simplified.

A basic configuration of the light-source device according to the present embodiment is similar to the configuration of the light-source device 80 according to the first embodiment. The light-source device according to the present embodiment is different from the light-source device 80 according to the first embodiment in an inclination angle of the laser device 10 with respect to the alignment direction of the plurality of laser devices 10.

Figure 14:
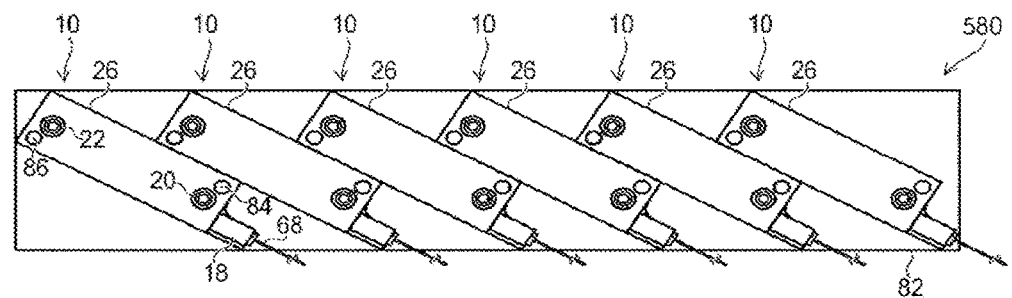
FIG. 14 is a plan view illustrating a light-source device according to a seventh embodiment of the disclosure.

FIG. 14 is a plan view illustrating the light-source device according to the present embodiment. As illustrated in FIG.

14, a light-source device 580 according to the present embodiment includes the substrate 82 and the plurality of laser devices 10 aligned and placed on the substrate 82, similarly to the light-source device 80 according to the first embodiment. Note that the fixing screws 90 and 92 and the busbar 88 and electrically connecting the terminal unit 20 and the terminal unit 22 are omitted from FIG. 14.

As described above, in the light-source device 80 according to the first embodiment, each of the plurality of laser devices 10 is arranged such that the length direction of the base plate portion 24, namely, the length direction of the housing 16 thereof is orthogonal to the alignment direction of the plurality of laser devices 10.

In contrast, in the light-source device 580 according to the present embodiment, each of the plurality of laser devices 10 is arranged such that the length direction of the base plate portion 24, namely, the length direction of the housing 16 is inclined by an acute or obtuse inclination angle with respect to the alignment direction of the plurality of laser devices 10. In other words, each of the plurality of laser devices 10 is arranged such that the length direction of the base plate portion 24 is inclined by a predetermined inclination angle other than 90° with respect to the alignment direction of the plurality of laser devices 10.

Note that each of the plurality of laser devices 10 arranged to be inclined is attached and fixed to the placement surface of the substrate 82, similarly to the laser device 10 of the light-source device 80 according to the first embodiment.

As in the present embodiment, each of the plurality of laser devices 10 may be arranged such that the length direction of the base plate portion 24 of the laser device 10 is inclined by an acute or obtuse inclination angle with respect to the alignment direction of the plurality of laser devices 10.

Note that, also in the present embodiment, a light-source device can be constituted by using the laser device 10 to which the lid portion 26 is not attached, similarly to the second embodiment. In this case, a lid portion can be attached and fixed to the light-source device, similarly to the second or third embodiment.

Eighth Embodiment

A laser device according to an eighth embodiment of the disclosure will be described using FIG. 15 and FIG. 16. Note that components similar to those of the laser device and the light-source device according to the first to seventh embodiments described above are denoted by the same reference signs, and description thereof will be omitted or simplified.

A basic configuration of the laser device according to the present embodiment is similar to the configuration of the laser device 10 according to the first embodiment. The laser device according to the present embodiment further includes an electronic component different from the semiconductor laser element 12 and terminal units corresponding to the electronic component, in addition to the configuration of the laser device 10 according to the first embodiment.

Figure 15:
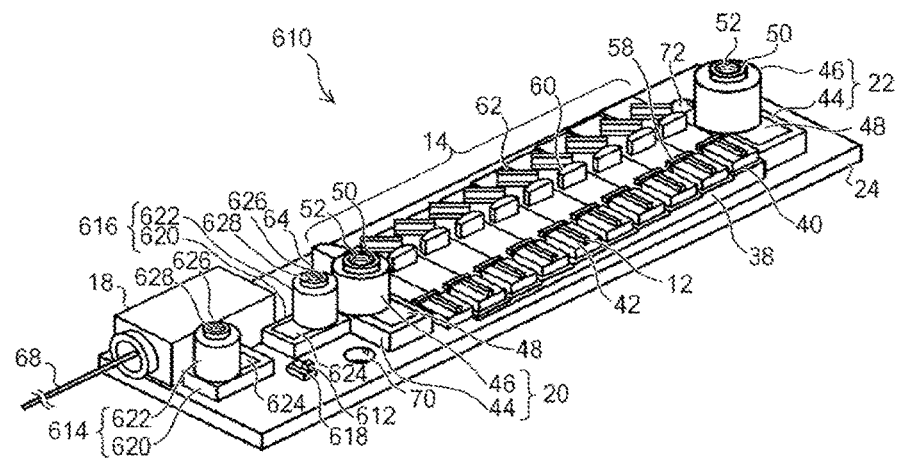
FIG. 15 is a perspective view illustrating a laser device according to an eighth embodiment of the disclosure.

FIG. 15 is a perspective view illustrating the laser device according to the present embodiment. FIG. 16 is an enlarged perspective view illustrating the electronic component in the laser device according to the present embodiment.

Figure 16:
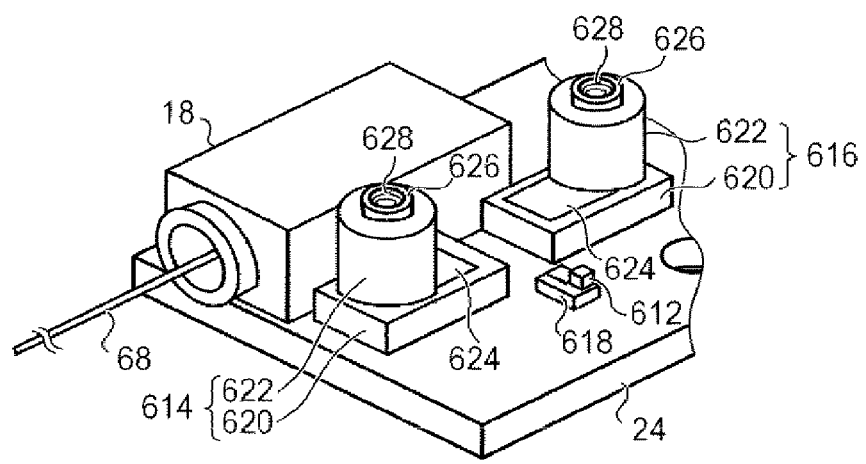
FIG. 16 is an enlarged perspective view illustrating an electronic component and terminal units in the laser device according to the eighth embodiment of the disclosure.

As illustrated in FIG. 15 and FIG. 16, the laser device 610 according to the present embodiment further includes an electronic component 612 and terminal units 614 and 616 corresponding to the electronic component 612, in addition to the configuration of the laser device 10 according to the first embodiment.

The electronic component 612 is provided on the upper surface of the base plate portion 24. Further, the terminal units 614 and 616 are also provided on the upper surface of the base plate portion 24.

The electronic component 612 is different from the semiconductor laser element 12, and is, for example, a temperature sensor such as a thermistor that detects a temperature of the base plate portion 24 or a temperature of a space above the base plate portion 24. The electronic component 612 is placed in a region near the output unit 18 on the base plate portion 24. The electronic component 612 is placed on the upper surface of the base plate portion 24 in the form of a COS fixed and equipped onto a submount 618, for example, by soldering and the like. The base plate portion 24 is expanded further than that in the first embodiment in order to provide the electronic component 612 and the terminal units 614 and 616 thereon.

Note that the electronic component 612 is not limited to a temperature sensor. The electronic component 612 may be, for example, a photodetector such as a photodiode.

The terminal units 614 and 616 corresponding to the electronic component 612 are each placed in a region near the electronic component 612 on the base plate portion 24. Each of the terminal units 614 and 616 is electrically connected to an external circuit unit related to the electronic component 612 and implements a function of the electronic component 612. When the electronic component 612 is a temperature sensor such as a thermistor, each of the terminal units 614 and 616 is connected to a predetermined terminal of a temperature measuring circuit, and temperature measurement by the temperature sensor is achieved.

The terminal units 614 and 616 each include a component connecting portion 620 and an external connecting portion 622 electrically connected to the component connecting portion 620. The terminal units 614 and 616 each utilize a screw as a connection form when being electrically connected to the outside. The component connecting portions 620 and the external connecting portions 622 of the terminal units 614 and 616 respectively have structures similar to those of the element connecting portions 44 and the external connecting portions 46 of the terminal units 20 and 22.

The component connecting portion 620 of each of the terminal units 614 and 616 is provided on the upper surface of the base plate portion 24. In this way, the component connecting portion 620, which a part of each of the terminal units 614 and 616, is provided on the base plate portion 24. The component connecting portion 620 of each of the terminal units 614 and 616 includes a sheet-like conductor 624. The sheet-like conductor 624 is provided in parallel with the base plate portion 24. The sheet-like conductor 624 is electrically connected to an electrode of the electronic component 612 via a wire by wire bonding, for example.

More specifically, the sheet-like conductor 624 of the component connecting portion 620 in the terminal unit 614 is electrically connected to one of electrodes of the electronic component 612 via a wire by wire bonding. Further, the sheet-like conductor 624 of the component connecting portion 620 in the terminal unit 616 is electrically connected to the other electrode of the electronic component 612 via a wire by wire bonding. Note that a method for electrically connecting the sheet-like conductor 624 of the component connecting portion 620 and an electrode of the electronic component 612 is not limited to a method by wire bonding, and various methods can be used.

The external connecting portion 622 of each of the terminal units 614 and 616 is provided on the component connecting portion 620. The external connecting portion 622 of each of the terminal units 614 and 616 includes a columnar conductor 626 formed into a columnar shape perpendicular to the base plate portion 24, for example. The columnar conductor 626 in each of the terminal units 614 and 616 is electrically connected to the sheet-like conductor 624. Each of the columnar conductors 626 includes, in an upper end thereof, a female screw hole 628 open upward. As described later, each of the female screw holes 628 is used for electrical connection to the outside. Hence, the external connecting portion 622 of each of the terminal units 614 and 616 is provided upward on the base plate portion 24, similarly to the external connecting portion 46 of each of the terminal units 20 and 22. In other words, the external connecting portion 622, which is a part of each of the terminal units 614 and 616, is provided on an opposite side to a placement surface, on which the base plate portion 24 is placed and fixed, to extend in an opposite direction to the placement surface.

The external connecting portion 622 of each of the terminal units 614 and 616 can be electrically connected to the outside by using a screw or a screw portion screwed into the female screw hole 628. For example, a busbar, which is a conducting bar, is fixed to the external connecting portion 622 by a screw screwed into the female screw hole 628 while being brought into contact with the columnar conductor 626, and the external connecting portion 622 can be electrically connected to the outside via the fixed busbar. Further, an external terminal including a male screw portion that is screwed into the female screw hole 628 is used, and the male screw portion of the external terminal is screwed and fixed into the female screw hole 628, whereby the external connecting portion 622 can be electrically connected to the outside via the fixed external terminal. Further, an external terminal, which is a circular or tip-opened crimping terminal, for example, is fixed, while being brought into contact with the columnar conductor 626, to the external connecting portion 622 by a male screw that is screwed into the female screw hole 628, and the external connecting portion 622 can be electrically connected to the outside via the fixed external terminal.

As in the present embodiment, the electronic component 612 and the terminal units 614 and 616 corresponding to the electronic component 612 may be further provided. In this case, the terminal units 614 and 616 corresponding to the electronic component 612 are also provided upward on the base plate portion 24 placed on the placement surface of the substrate. Thus, when a light-source device is constituted, space does not need to be secured for the terminal units 614 and 616, similarly to the terminal units 20 and 22, and a footprint of the light-source device can be reduced. In this way, space saving can be achieved.

The terminal units 614 and 616 also include the female screw holes 628 and are electrically connected to the outside by screws. Thus, dissimilar to a case where a lead pin is used, soldering does not need to be performed also on the terminal units 614 and 616, and excellent workability can be secured for electrical connection to the outside.

Note that, also in the present embodiment, the lid portion 26 can be attached and fixed to the laser device 610, similarly to the first embodiment. In this case, openings 630 and 632 are provided in the top plate 36 of the lid portion 26, respectively corresponding to the external connecting portions 622 of the terminal units 614 and 616. The external connecting portions 622 of the terminal units 614 and 616 protrude to the upper side of the top plate 36 partially, namely, to the outside of the housing 16 constituted by the base plate portion 24 and the lid portion 26 via the openings 630 and 632 provided in the top plate 36, respectively. In this way, the external connecting portions 622 of the terminal units 614 and 616 protrude from the upper surface of the housing 16 partially to the outside of the housing 16. Each of the external connecting portions 622 protruding to the outside of the housing 16 partially includes the female screw hole 628 facing upward. Note that the lid portion 26 is expanded further than that in the first embodiment to correspond to the expanded base plate portion 24 in order to house the electronic component 612 and the terminal units 614 and 616 in the housing 16.

Further, when a light-source device is constituted by using the laser device 610, the lid portion 226 or the lid portion 326 can be attached and fixed to the light-source device, similarly to the second or third embodiment.

It is described above that the electronic component 612 and the terminal units 614 and 616 are provided, in addition to the configuration of the laser device 10 according to the first embodiment, but the configuration is not limited thereto. The electronic component 612 and the terminal units 614 and 616 may be provided in addition to the configuration of the laser devices 210, 310, and 410 according to the fourth to sixth embodiments.

The terminal units 614 and 616 corresponding to the electronic component 612 may include the external connecting portions 622 provided outside the base plate portion 24, similarly to the terminal units 320 and 322 according to the fifth embodiment. The terminal units 614 and 616 corresponding to the electronic component 612 may utilize an opening as a connection form, similarly to the terminal units 420 and 422 according to the sixth embodiment.

Alternate Embodiment

The disclosure is not limited to the above-described embodiments, and various modification can be achieved.

For example, the case where the laser devices 10, 210, 310, 410, and 610 include the plurality of semiconductor laser elements 12 is described as an example in the above-described embodiments, but the configuration is not limited thereto. The laser devices 10, 210, 310, 410, and 610 may include one semiconductor laser element 12.

Further, the case where the entire lateral sides of the semiconductor laser elements 12, the optical system 14, the terminal units 20 and 22, and the like placed on the mount surfaces including the upper surface of the base plate portion 24 and the upper surfaces of the plurality of steps 40 in the stepped portion 38 are exposed is described as an example in the above-described embodiments, but the configuration is not limited thereto. The lateral sides of the semiconductor laser elements 12 and the like placed on the upper surface of the base plate portion 24 may be partially covered by a side wall and the like, and may be partially exposed.

Further, the case where the terminal units 20, 22, 320, and 322 include the female screw holes 52 and 352 is described as an example in the above-described embodiments, but the configuration is not limited thereto. The terminal units 20, 22, 320, and 322 each can include a male screw portion for electrical connection to the outside, in place of the female screw holes 52 and 352. In this case, for example, an external terminal contacting the male screw portion by a ring-shaped portion and the like inserted into the male screw portion can be fixed to the terminal units 20, 22, 320, and 322 by using a nut and the like screwed into the male screw portion. The terminal units 614 and 616 that correspond to the electronic component 612 may also include the male screw portion similarly.

Further, the terminal units 20, 22, 320, 322, 420, and 422 that utilize a screw or an opening as a connection form are described as examples in the above-described embodiments, but the configuration is not limited thereto. The terminal units 20, 22, 320, 322, 420, and 422 utilizing other connection forms can be used. For example, the terminal units 20, 22, 320, 322, 420, and 422 can utilize a jack, into which a plug such as a banana plug is insertable, as a connection form. The terminal units 614 and 616 corresponding to the electronic component 612 can also utilize other connection forms similarly.

Further, the case where the plurality of laser devices 10 and 210 are placed on the substrates 82 and 282 is described as an example in the above-described embodiments, but the configuration is not limited thereto. The plurality of laser devices 10 and 210 can be placed on placement surfaces of various base members such as an installation base other than the substrates 82 and 282.

Further, the case as illustrated in FIG. 3A and FIG. 3B where the plurality of laser devices 10 aligned in one line include the output units 18 facing toward the same side of the alignment direction is described as an example in the above-described embodiments, but the configuration is not limited thereto. For example, the plurality of laser devices 10 aligned in one line may include the output units 18 facing alternately toward one side and the other side of the alignment thereof. In this case, since the terminal units 20 and 22 that need to be connected with the busbar 88 of two adjacent laser devices 10 are located on the same side, a length of the busbar 88 can be shortened, and thus an electrical connection path can be shortened.

Further, the case as illustrated in FIG. 4 where the light-source device 80 is used as an excitation light source of the optical fiber laser 94 is described as an example in the above-described embodiments, but the configuration is not limited thereto. The light-source device 80 can be used as light sources of various devices, such as a device that performs wavelength synthesis and a device that performs polarization synthesis, or systems. The light-source device 80 can also be used as a direct diode laser. For example, the light-source device 80 can be used together with an optical system on which laser light, output from the plurality of laser devices 10 in the light-source device 80, is incident. The optical system includes a lens such as a condenser lens, a combiner, a mirror, and the like. More specifically, laser light output from the plurality of laser devices 10 in the light-source device 80 can be condensed by the optical system including the lens and output. Further, laser light output from the plurality of laser devices 10 in the light-source device 80 can be combined by the combiner and output. Note that the plurality of laser devices 10 in the light-source device 80 may have the same laser characteristic of a wavelength and the like of laser light, or may have mutually different laser characteristics thereof. The laser characteristic of the plurality of laser devices 10 may be appropriately set according to application of the light-source device 80.

REFERENCE SIGNS LIST 10, 210, 310, 410, 610 Laser device
12 Semiconductor laser element
16 Housing
18 Output unit
20, 320, 420 Terminal unit
22, 322, 422 Terminal unit
24 Base plate portion
80, 801, 802, 280, 580 Light-source device
82, 282 Substrate
94 Optical fiber laser
96 Pump combiner
98 Rare-earth doped optical fiber
612 Electronic component
614 Terminal unit
616 Terminal unit

The invention claimed is:
1. A laser device comprising: a mount member including a mount surface; a semiconductor laser element placed on the mount surface of the mount member; a lid portion; and a terminal unit including an external connecting portion and a columnar conductor, the terminal unit being provided upward on the mount member and electrically connectable, via a conductive part, to an outside of a housing, the conductive part being contacted with and fixed to the terminal unit by a screw screwed into the terminal unit, the external connecting portion partially protruding upward through a top plate of the lid portion provided over the mount member, the columnar conductor formed into a columnar shape perpendicular to the mount member, the columnar conductor including, in an upper end thereof, a female screw hole configured to receive the screw, wherein in a state where the semiconductor laser element is electrically connected or optically and positionally aligned via a part where an upper side and lateral sides of the semiconductor laser element on the mount surface are being exposed, the semiconductor laser element is not electrically connected or optically and positionally aligned to a member provided on a side wall portion of the lid portion, and the lid portion is provided on the mount surface of the mount member.

2. The laser device according to claim 1, further comprising an optical element placed on the mount surface of the mount member.

3. The laser device according to claim 1, further comprising an output unit that is provided on the mount surface of the mount member and outputs, through an optical fiber, laser light output from the semiconductor laser element.

4. The laser device according to claim 3, wherein a part of the terminal unit is provided on the mount member.

5. The laser device according to claim 1, wherein the mount member has a heat conductivity higher than a heat conductivity of the lid portion.

6. A light-source device comprising:
   a plurality of the laser devices according to claim 1; and
   a base member including a placement surface on which the plurality of laser devices are placed.

7. The light-source device according to claim 6, further comprising an optical system on which laser light output from the plurality of laser devices is incident.

8. The light-source device according to claim 6, wherein the lid portion is provided on the mount surface of the mount member of each of the plurality of laser devices.

9. An optical fiber laser comprising:
   the light-source device according to claim 6;
   an optical fiber for amplification; and
   an incidence unit that causes laser light, output from the plurality of laser devices of the light-source device, to be incident on the optical fiber for amplification.

10. A light-source device comprising:
   a plurality of the laser devices according to claim 1, wherein the terminal unit of one of the laser devices is electrically connected to the terminal unit of another of the laser devices via the conductive part to make the plurality of the laser devices connected in series.

* * * * *